a2

(12) United States Patent
Tu et al.

(10) Patent No.: US 11,011,224 B2
(45) Date of Patent: May 18, 2021

(54) MEMORY DEVICE AND METHOD FOR FORMING THE SAME

(71) Applicant: TAIWAN SEMICONDUCTOR MANUFACTURING CO., LTD., Hsinchu (TW)

(72) Inventors: Kuo-Chi Tu, Hsinchu (TW); Chu-Jie Huang, Tainan (TW); Sheng-Hung Shih, Hsinchu (TW); Nai-Chao Su, Tainan (TW); Wen-Ting Chu, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/700,918

(22) Filed: Dec. 2, 2019

(65) Prior Publication Data
US 2020/0105343 A1    Apr. 2, 2020

Related U.S. Application Data

(63) Continuation of application No. 15/870,620, filed on Jan. 12, 2018, now Pat. No. 10,497,436.

(60) Provisional application No. 62/591,113, filed on Nov. 27, 2017.

(51) Int. Cl.
| | |
|---|---|
| *G11C 11/34* | (2006.01) |
| *G11C 13/00* | (2006.01) |
| *H01L 21/02* | (2006.01) |
| *H01L 45/00* | (2006.01) |
| *H01L 27/24* | (2006.01) |
| *H01L 21/321* | (2006.01) |

(52) U.S. Cl.
CPC .... *G11C 13/0007* (2013.01); *H01L 21/02008* (2013.01); *H01L 21/3212* (2013.01); *H01L 27/2436* (2013.01); *H01L 27/2463* (2013.01); *H01L 45/08* (2013.01); *H01L 45/1233* (2013.01); *H01L 45/146* (2013.01); *H01L 45/147* (2013.01)

(58) Field of Classification Search
CPC .......... G11C 13/0007; H01L 21/02008; H01L 21/3212; H01L 27/2436; H01L 27/2463; H01L 45/08; H01L 45/1233; H01L 45/146; H01L 45/147
USPC .................................................. 365/186, 51
See application file for complete search history.

(56) References Cited

U.S. PATENT DOCUMENTS

| | | | |
|---|---|---|---|
| 6,097,051 | A  | 8/2000 | Torii et al. |
| 6,770,210 | B2 | 8/2004 | Hashimoto et al. |
| 7,745,865 | B2 | 6/2010 | Tu |
| 8,097,870 | B2 | 1/2012 | Hutchinson et al. |

(Continued)

FOREIGN PATENT DOCUMENTS

JP    2008210843 A    9/2008

*Primary Examiner* — Viet Q Nguyen
(74) *Attorney, Agent, or Firm* — Maschoff Brennan

(57) ABSTRACT

A memory device includes a metal structure, a first dielectric layer, a bottom electrode, a second dielectric layer, a resistance switching layer, and a top electrode. The first dielectric layer surrounds the metal structure. The bottom electrode is in contact with a top surface of the metal structure. The second dielectric layer surrounds the bottom electrode, in which a top surface of the bottom electrode is higher than a top surface of the second dielectric layer. The resistance switching layer is over the bottom electrode. The top electrode is over the resistance switching layer.

20 Claims, 31 Drawing Sheets

(56) References Cited

U.S. PATENT DOCUMENTS

| | | |
|---|---|---|
| 8,339,841 B2 | 12/2012 | Iwayama |
| 8,742,390 B1 | 6/2014 | Tu et al. |
| 8,871,604 B2 | 10/2014 | Tu |
| 8,895,953 B1 | 11/2014 | Shields et al. |
| 8,902,634 B2 | 12/2014 | Iwayama |
| 9,178,008 B2 | 11/2015 | Chen et al. |
| 9,231,197 B2 | 1/2016 | Tu et al. |
| 9,431,603 B1* | 8/2016 | Hsieh .................. H01L 45/1691 |
| 9,502,466 B1* | 11/2016 | Chuang .................. H01L 43/08 |
| 9,543,511 B2 | 1/2017 | Sung et al. |
| 9,583,556 B2 | 2/2017 | Tu et al. |
| 9,673,391 B2 | 6/2017 | Tu et al. |
| 9,711,508 B2 | 7/2017 | Yang et al. |
| 9,799,705 B1* | 10/2017 | Yi ....................... H01L 27/2436 |
| 9,853,215 B1* | 12/2017 | Tseng .................... H01L 45/16 |
| 9,859,336 B1* | 1/2018 | Tseng ................. H01L 27/2436 |
| 10,163,651 B1* | 12/2018 | Chen ................. H01L 21/31055 |
| 10,164,181 B2* | 12/2018 | Yang ..................... H01L 45/146 |
| 10,177,311 B1 | 1/2019 | Hsieh et al. |
| 10,497,436 B2* | 12/2019 | Tu ....................... H01L 45/1233 |
| 10,847,716 B1* | 11/2020 | Lee ..................... H01L 45/1253 |
| 2001/0035550 A1 | 11/2001 | Yamazaki et al. |
| 2002/0055016 A1 | 5/2002 | Hiramoto et al. |
| 2004/0166668 A1 | 8/2004 | Ito |
| 2005/0051829 A1 | 3/2005 | Goto et al. |
| 2006/0240577 A1 | 10/2006 | Ashikaga |
| 2007/0045605 A1 | 3/2007 | Hsueh |
| 2009/0321711 A1 | 12/2009 | Takagi et al. |
| 2011/0037046 A1 | 2/2011 | Sato et al. |
| 2011/0037108 A1 | 2/2011 | Suguira et al. |
| 2012/0256152 A1 | 10/2012 | Kakegawa |
| 2013/0140515 A1 | 6/2013 | Kawashima et al. |
| 2014/0002976 A1* | 1/2014 | Brain ................ H01L 27/10894 361/679.02 |
| 2014/0070162 A1 | 3/2014 | Iwayama |
| 2015/0236257 A1* | 8/2015 | Walls .................. H01L 45/1273 257/3 |
| 2015/0295172 A1* | 10/2015 | Sung ................... H01L 45/1233 257/2 |
| 2015/0380479 A1 | 12/2015 | Narusawa |
| 2016/0190442 A1* | 6/2016 | Fest ....................... H01L 45/08 257/4 |
| 2016/0218146 A1* | 7/2016 | Lee ....................... H01L 45/146 |
| 2019/0123270 A1 | 4/2019 | Mo et al. |
| 2020/0006431 A1* | 1/2020 | Mayuzumi .......... H01L 27/2481 |
| 2020/0127189 A1* | 4/2020 | Liao ..................... H01L 27/228 |
| 2020/0243758 A1* | 7/2020 | Marchack ............ H01L 27/222 |

* cited by examiner

MEMORY DEVICE AND METHOD FOR FORMING THE SAME

PRIORITY CLAIM AND CROSS-REFERENCE

The present application is a continuation application of U.S. application Ser. No. 15/870,620, filed Jan. 12, 2018, now U.S. Pat. No. 10,497,436, issued Dec. 3, 2019, which claims priority to U.S. Provisional Application Ser. No. 62/591,113, filed Nov. 27, 2017, which is herein incorporated by reference in their entirety.

BACKGROUND

In integrated circuit (IC) devices, resistive random access memory (RRAM) is an emerging technology for next generation non-volatile memory devices. RRAM is a memory structure including an array of RRAM cells each of which stores a bit of data using resistance values. Particularly, RRAM cell includes a resistive material layer, the resistance of which can be adjusted to represent logic "0" or logic "1."

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
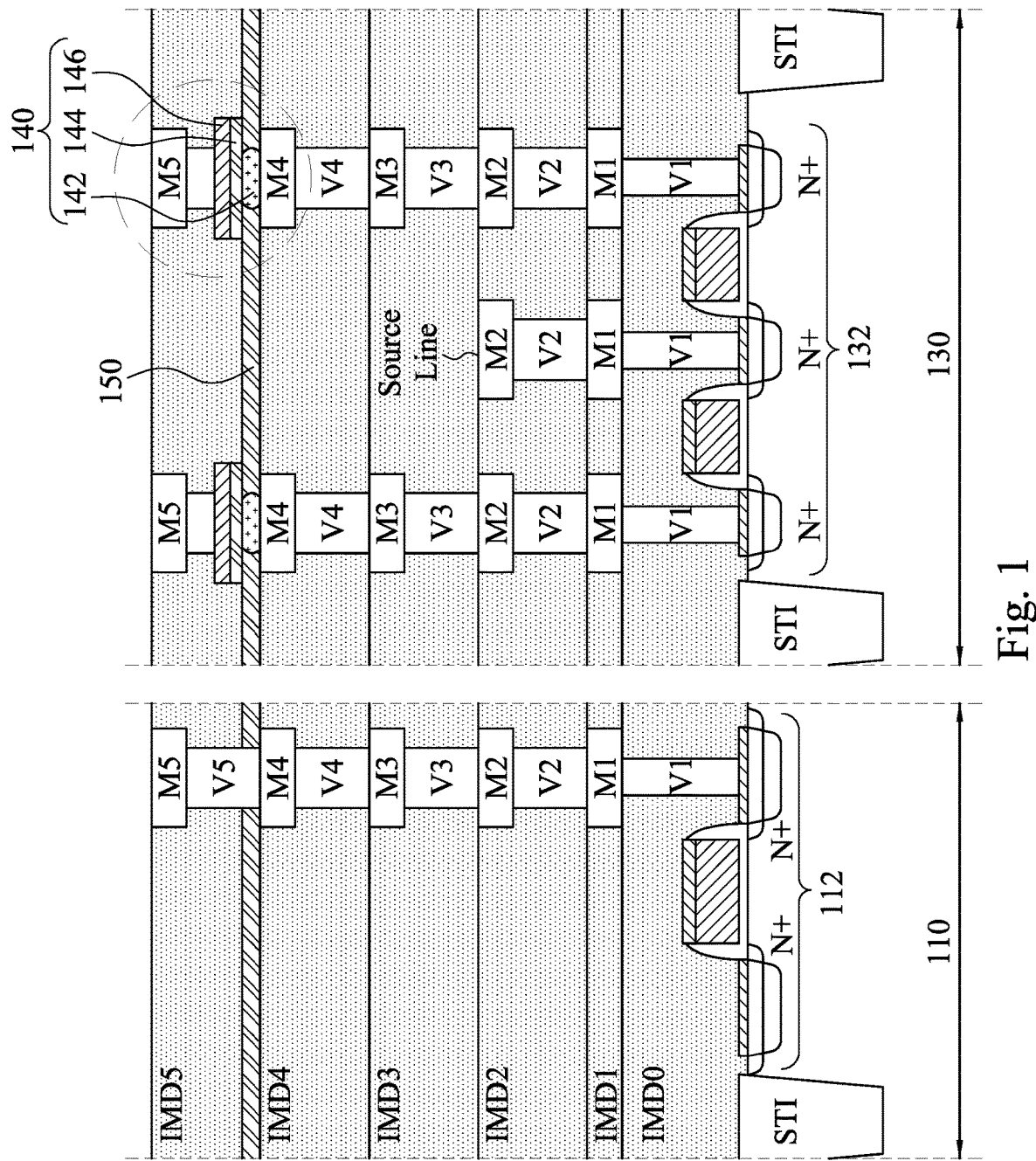
FIG. 1 is a cross-sectional view of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a system-on-chip (SOC) 100, which may include a plurality of functional areas fabricated on a single substrate. As depicted in FIG. 1, the SOC 100 includes a logic area 110 and a non-volatile memory (NVM) cell 130. The logic area 110 may include circuitry, such as an exemplary transistor 112, for processing information received from the non-volatile memory cell 130 and for controlling reading and writing functions of the NVM cell 130. In some embodiments, the NVM cell 130 is a resistive random-access memory (RRAM) cell; the RRAM is one of several different types of non-volatile computer memory. While the NVM cell 130 may frequently be referred to herein as an RRAM cell 130, the SOC 100 is not limited to RRAM cells.

An RRAM cell may be used to hold a binary piece of data, or a bit, by altering the properties of an intermediate dielectric layer in memory elements in such a way so as to alter the resistance of the layer. A bit may be encoded by setting the resistance of the dielectric layer to a relatively high resistance state or a relatively low resistance state, with a value of one assigned to one state and a value of zero assigned to the other state. More particularly, an RRAM cell operates under the principle that a dielectric, which is normally insulating, can be made to conduct through filaments or conduction paths formed after the application of a sufficiently high voltage. The forming of filaments or conduction paths can be referred to as a forming operation or forming process of the RRAM cell. The sufficiently high voltage can be referred to as a 'form' voltage used in the forming operation of the RRAM cell. The 'form' voltage is a different voltage from the voltage used to read and write the RRAM cell. In some embodiments, the 'form' voltage is at a higher absolute value or has a different polarity. During the write operation, the filaments or conductions path are broken by passing a voltage different from the 'form' voltage. In some embodiments, the 'write' voltage has a different polarity than the 'form' voltage. A subsequent write operation applies yet a different voltage that is less than the 'form' voltage to reconnect the broken filament. By changing the filaments, a high or low resistance is stored in the RRAM cell that does not change when the power is removed. Either the high resistance or the low resistance may be read as a "0" or "1", respectively. During a read operation, a 'read' voltage is applied across the RRAM cell. In some embodiments, the 'read' voltage is much smaller than the 'write' voltage to avoid inadvertent writing of the RRAM cell to a different value.

The RRAM cell includes a layer of high-k dielectric material arranged between bottom and top electrodes disposed within a back-end-of-the-line (BEOL) metallization stack. The RRAM cell is operated based upon a process of reversible switching between resistive states of the high-k dielectric material. An RRAM cell having a first (e.g., high) resistive state corresponds to a first data value (e.g., a logical "0") and an RRAM cell having a second (e.g., low) resistive state corresponds to a second data value (e.g., a logical "1"). This reversible switching is enabled by selectively forming conductive filaments through the layer of high-k dielectric material. For example, the layer of high-k dielectric material, which is normally insulating, can be made to conduct by applying a voltage across the bottom and top electrodes to form conductive filaments extending through the layer of high-k dielectric material. It is observed that unwanted distribution of conductive filaments would occur in the layer of high-k dielectric material, if the layer of high-k dielectric material is coated on a sharp corner (i.e. corner with an acute angle) of the bottom electrode. For example, conductive filaments may be unwantedly formed around the sharp corner of the bottom electrode. The unwanted distribution of conductive filaments would lead to unwanted leakage paths from the bottom electrode to the top electrode, which in turn would frustrate control of the RRAM cell. Embodiments of the present disclosure offer advantages, such as addressing the aforesaid issue about the unwanted distribution of filaments in the layer of high-k dielectric material, though it is understood that other embodiments may offer different advantages, not all advantages are necessarily discussed herein, and no particular advantage is required for all embodiments.

Figure 2:
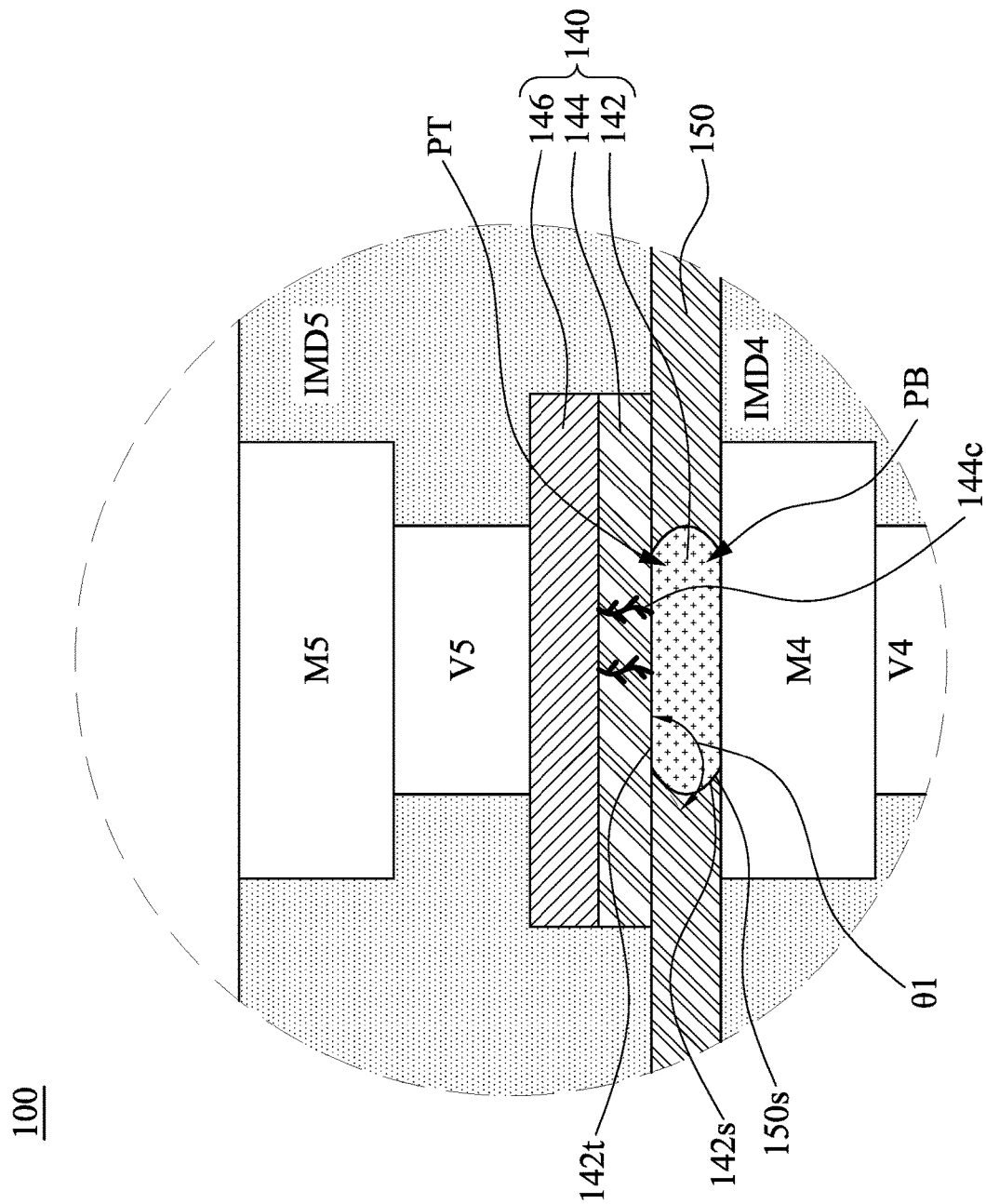
FIG. 2 is an enlarged cross-sectional view of the semiconductor device in FIG. 1.

Attention is now invited to FIGS. 1 and 2. The RRAM cell 130 may include metal-insulator-metal (MIM) structures 140. Each MIM structure 140 may include a bottom electrode 142 and top electrode 146, with a high-k dielectric layer 144 in between the two electrodes 142 and 146. Stated in a different way, the bottom electrode 142 is separated from the top electrode 146 by the high-k dielectric layer 144. Conductive filaments 144c, comprising chains of oxygen vacancies, may extend from the bottom electrode 142 to the top electrode 146 through the high-k dielectric layer 144 after the 'form' operation has been performed on the RRAM cell 130. As a result, a resistance of the high-k dielectric layer 144 can be altered, and hence the high-k dielectric layer 144 can be equivalently referred to as a resistance switching layer in some embodiments. The bottom electrode 142 has a top surface 142t and a sidewall 142s extending from an edge of the top surface 142t at an obtuse angle relative to the top surface 142t. Stated in another way, an included angle θ1 between the top surface 142t and the sidewall 142s of the bottom electrode 142 is greater than 90 degrees. The obtuse included angle θ1 between the top surface 142t and the sidewall 142s of the bottom electrode 142 forms a smooth top corner rather than a sharp top corner. Smooth contour of the top corner of the bottom electrode 142 contributes to reducing unwanted formation of conductive filaments 144c around the top corner, which in turn will decrease unwanted leakage paths between the bottom and top electrodes 142 and 146, which in turn will result in improved control and reliability of the RRAM cell 130.

As illustrated in FIG. 2, in some embodiments, the sidewall 142s of the bottom electrode 142 is curved. By way of example, the sidewall 142s of the bottom electrode 142 is a convex surface, so that the included angle θ1 between the top surface 142t and the sidewall 142s of the bottom electrode 142 can be greater than 90 degrees, which in turn will decrease unwanted leakage paths between the bottom and top electrodes 142 and 146.

As illustrated in FIG. 2, in some embodiments, the bottom electrode 142 includes a top portion PT in contact with the resistance switching layer 144. The top portion PT tapers towards the resistance switching layer 144. For example, the top portion PT of the bottom electrode 142 has a width decreasing as a distance from the resistance switching layer 144 decreases. The taper profile of the top portion PT would result in an obtuse included angle θ1 between the top surface 142t and the sidewall 142s of the bottom electrode 142, which in turn will be advantageous for reduction of unwanted leakage paths between the bottom and top electrodes 142 and 146. In further embodiments, the top portion PT of the bottom electrode 142 has a convex sidewall extending at an obtuse angle relative to the top surface 142t of the bottom electrode 142.

In some embodiments, the bottom electrode 142 further includes a bottom portion PB below the top portion PB. The bottom portion PB tapers away from the top portion PT. Because the resistance switching layer 144 is above the top portion PT of the bottom electrode 142, the bottom portion PB tapers away from the resistance switching layer 144 as well. For example, the bottom portion PB has a width decreasing as a distance from the resistance switching layer 144 increases. In further embodiments, the bottom portion PB of the bottom electrode 142 has a convex sidewall continuously extending from the convex sidewall of the top portion PB.

In some embodiments, the bottom electrode 142 may be made of gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta) or indium-tin oxide (ITO), or any alloy, oxide, nitride, fluoride, carbide, boride or silicide of these, such as TaN, TiN, TiAlN, TiW, combinations thereof, or the like.

The resistance switching layer 144 is formed over the bottom electrode 142 and directly contacts the bottom electrode 142. In some embodiments, the resistance switching layer 144 may include one or more oxide of W, Ta, Ti, Ni, Co, Hf, Ru, Zr, Zn, Fe, Sn, Al, Cu, Ag, Mo, Cr, other suitable materials, or the like. In some cases, silicon may be included to form a composite material. In some embodiments, hafnium oxide and/or zirconium oxide are used.

The top electrode 146 is formed over the resistance switching layer 144. In some embodiments, the top electrode 146 may be formed from materials such as gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta) or indium-tin oxide (ITO), or any alloy, oxide, nitride, fluoride, carbide, boride or silicide of these, such as TaN, TiN, TiAlN, TiW, combinations thereof, or the like.

The MIM structures 140 may be fabricated in conjunction with using semiconductor fabrication techniques known to those of skill in the art. Other types of non-volatile computer memory that may be substituted for the RRAM cell in some embodiments of the SOC 100 that include flash memory, ferroelectric RAM, magnetic RAM, phase-change RAM.

Other features depicted in FIG. 1 include shallow-trench isolation (STI) features, and pluralities of metallization layers and vias. As depicted, the SOC 100 is fabricated using, for example, five metallization layers, labeled as M1 through M5, with five layers of metallization vias or interconnects, labeled as V1 through V5. Other embodiments may contain more or fewer metallization layers and a corresponding more or fewer number of vias. The RRAM cell 130 includes a full metallization stack connecting the MIM structures 140 to the RRAM transistors 132, and a partial metallization stack connecting a source line to the RRAM transistors 132. The MIM structures 140 are depicted as being fabricated in between the top of the M4 layer and the bottom the M5 layer, and hence bottom electrodes 142 of the MIM structures 140 are in contact with the M4 layer. Therefore, the bottom electrodes 142 are electrically connected to the M4 layer. The logic area 110 includes a full metallization stack, including a portion of each of metallization layers M1-M5 connected by interconnects V2-V5, with V1 connecting the stack to a source/drain contact of the logic transistor 112.

Also included in SOC 100 is a plurality of inter-metal dielectric (IMD) layers. Six IMD layers, identified as IMD0 through IMD5 are depicted in FIG. 1 as spanning the logic area 110 and the RRAM cell 130. The IMD layers may provide electrical insulation as well as structural support for the various features of the SOC 100 during many fabrication process steps, some of which will be discussed herein. For example, the IMD layers can act as structural support for the MIM structures 140. Specifically, the MIM structures 140 are disposed over a top surface of IMD4. In some embodiments, the IMD layers may be silicon oxide, low-k silicon oxide such as a porous silicon oxide layer, other suitable interlayer dielectric (ILD) material, other suitable inter-metal dielectric material, combinations thereof, or the like. In some embodiments, the IMD layers are low-k dielectric layers made from extra low-k materials, extreme low-k materials, combinations thereof, or the like. In some embodiments, IMD layers may have a dielectric constant lower than 2.4. In some embodiments, IMD layers are made using diethoxymethylsilane (mDEOS) or the like as a precursor gas in a chemical vapor deposition (CVD) process. However, other low-k dielectric materials may be used as well.

Also included in the SOC 100 is a polish stop layer 150. The polish stop layer 150 spans the logic area 110 and the RRAM cell 130 and is used to slow down or even stop the chemical mechanical polish (CMP) operation performed to the bottom electrodes 142 during fabrication of the MIM structures 140. In some embodiments, the polish stop layer 150 may include dielectric materials, such as silicon oxynitride, silicon nitride, carbon doped silicon nitride, carbon doped silicon oxide, other suitable dielectric materials, combinations thereof, or the like. The polish stop layer 150 can be equivalently referred to as a dielectric layer over IMD4 in some embodiments. The polish stop layer 150 and the bottom electrodes 142 have different CMP properties. In further embodiments, the polish stop layer 150 is selected to have a different CMP resistance selectivity than the bottom electrodes 142. As a result, the CMP stop layer 150 can slow down or even stop the CMP operation performed to the bottom electrodes 142.

As illustrated in FIGS. 1 and 2, the bottom electrode 142 is embedded in the polish stop layer 150. Stated differently, the bottom electrode 142 is surrounded by and in contact with the polish stop layer 150. As a result, the convex sidewalls of the top and bottom portions PT and PB of the bottom electrode 142 are in contact with the polish stop layer 150. For example, the polish stop layer 150 has a sidewall 150s in contact with and conformal to the sidewall 142s of the bottom electrode 142. As a result, the sidewall 150s of the polish stop layer 150 is curved as well. In further embodiments, the sidewall 150s of the polish stop layer 150 is concave, and the sidewall 150s of the polish stop layer 150 and the sidewall 142s of the bottom electrode 142 have substantially the same curvature.

Figure 3:
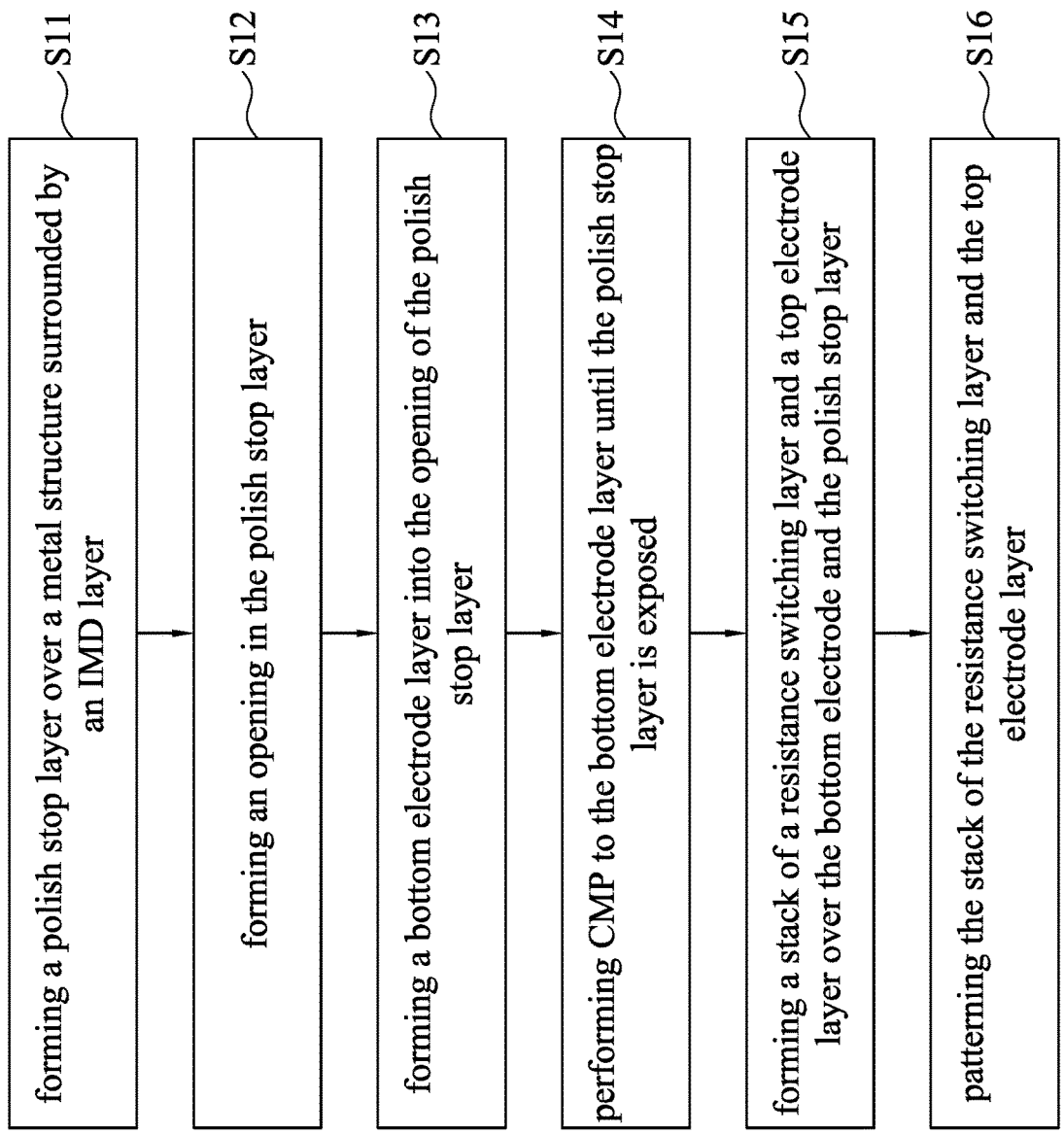
FIG. 3 is a flow chart of a method of forming a memory device in accordance with some embodiments.

Referring now to FIG. 3, illustrated is a method M1 of forming a memory device in accordance with some embodiments. The method M1 may be incorporated into a back-end-of-line (BEOL) process in some embodiments. It is understood that parts of the method M1 and/or any of the exemplary metallization and dielectric layers discussed with reference to the method M1 may be fabricated by a BEOL process flow, and thus some processes are briefly described herein. FIGS. 4A, 4B, 4C, 4D, 4E and 4F are cross-sectional views of an SOC 200, which may be similar in many aspects to SOC 100, in various stages of fabrication in accordance with some embodiments of the present disclosure.

Figure 4A:
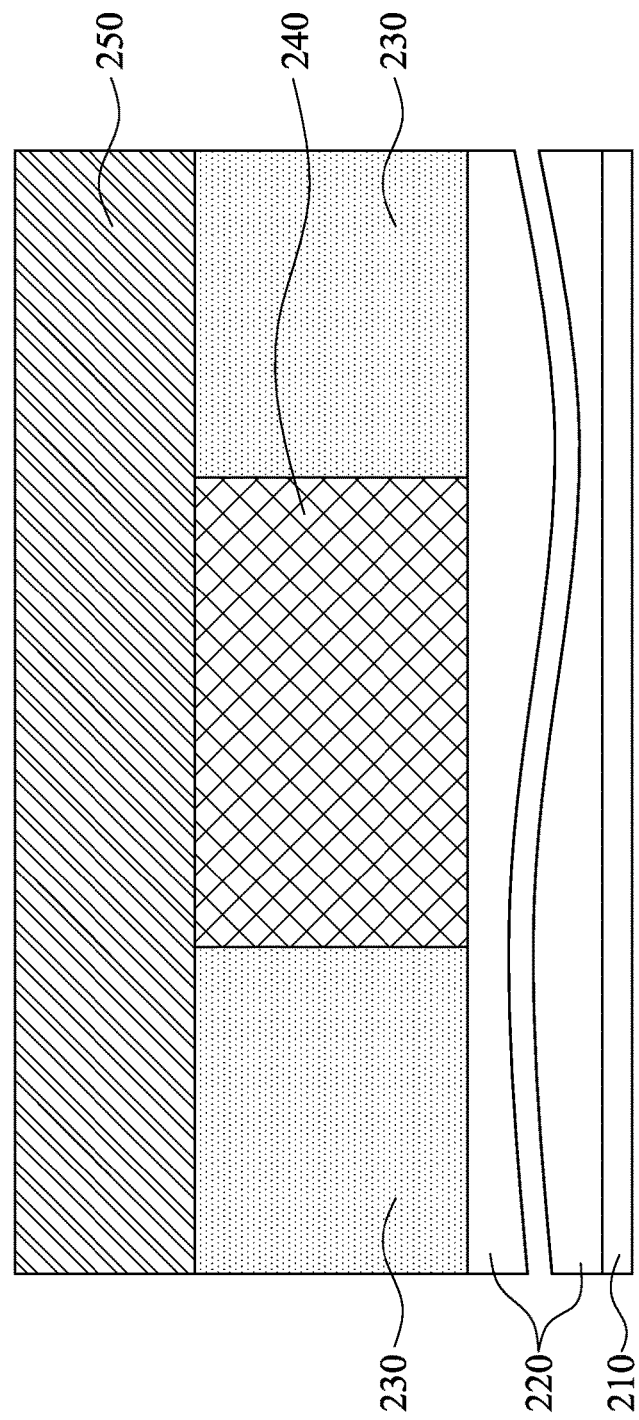
FIGS. 4A, 4B, 4C, 4D, 4E and 4F are cross-sectional views of the memory device at various stages of the method in FIG. 3 in accordance with some embodiments of the present disclosure.

The method M1 begins at block S11 where a polish stop layer is formed over a metal structure surrounded by an IMD layer. Referring to FIG. 4A, in some embodiments of block S11, a polish stop layer 250 is blanket formed over an IMD layer 230 and over a metal structure 240 surrounded by the IMD layer 230. As illustrated, the IMD layer 230 and the metal structure 240 are over an intermediate layer 220 formed on a substrate 210. The substrate 210 may be a semiconductor substrate, such as a silicon substrate. Alternatively, the substrate 210 may comprise another elementary semiconductor, such as germanium or the like; a compound semiconductor including silicon carbide or the like; an alloy semiconductor including silicon germanium or the like; combinations thereof, or the like. In some embodiments, the substrate 210 is a semiconductor on insulator (SOI) substrate. The substrate 210 may include doped regions, such as p-wells and n-wells.

The intermediate layer 220 includes a plurality of semiconductor device layers that, for convenience and clarity, are not individually depicted. The plurality of layers depicted as the single intermediate layer 220 may include transistors and contact layers, interconnects between metallization layers, metallization layers, IMD layers, and others. Thus, for example, the intermediate layer 220 includes IMD0-3 and all layers embedded therein as depicted by FIG. 1. Therefore, in some embodiments, the IMD layer 230 and the metal structure 240 are equivalently referred to as IMD4 and M4 as depicted in FIG. 1, respectively. The IMD layer 230 and the metal structure 240 may be fabricated, for example, using a single damascene process or a dual damascene process that includes a CMP process to planarize the metal structure 240 with the IMD layer 230.

After planarizing the metal structure 240 with the IMD layer 230, the polish stop layer 250 is blanket deposited over the IMD layer 230 and the metal structure 240. The polish stop layer 250 may include silicon oxynitride, silicon nitride, carbon doped silicon nitride, carbon doped silicon oxide, other suitable materials, combinations thereof, or the like. The polish stop layer 250 is selected to have a different CMP selectivity than a bottom electrode layer of the RRAM cell formed in a subsequent step. The polish stop layer 250 is deposited over the planarized top surfaces of the IMD layer 230 and the metal structure 240 using a chemical vapor deposition (CVD) process such as plasma enhanced (PE) CVD, high-density plasma (HDP) CVD, inductively-coupled-plasma (ICP) CVD, thermal CVD, or the like.

Figure 4B:
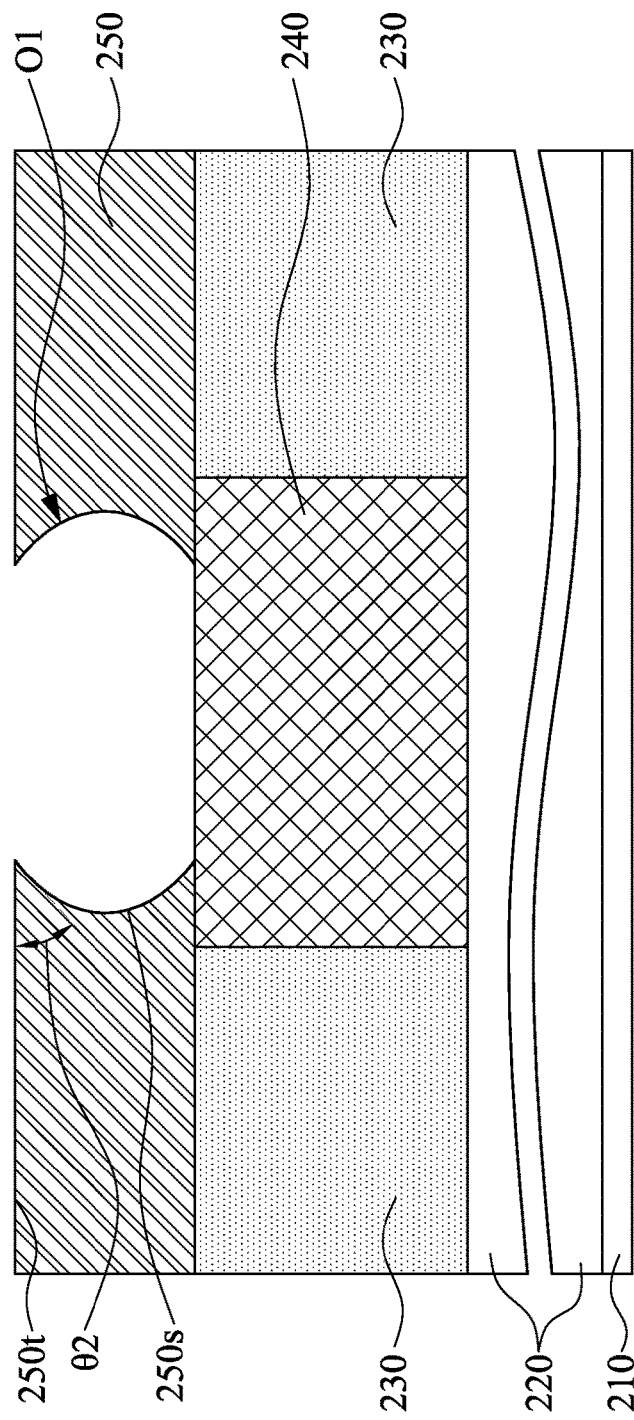

Returning to FIG. 3, the method M1 then proceeds to block S12 where an opening is formed in the polish stop layer. With reference to FIG. 4B, in some embodiments of block S12, an etch process is carried out to the polish stop layer 250 to form an opening O1 until the metal structure 240 is exposed. Conditions of the etch process is selected such that a sidewall 250s of the opening O1 extends at an acute angle relative to a top surface of the polish stop layer 250. For example, an included angle θ2 between the top surface 250t of the polish stop layer 250 and the sidewall 250s of the opening O1 is less than 90 degrees. This acute angle θ2 will be advantageous for forming a bottom electrode with a smooth top corner, as will be explained further below. In further embodiments, the sidewall 250s of the opening O1 is curved. For example, the sidewall 250s of the opening O1 is concave. Such a concave opening O1 is advantageous from forming a bottom electrode with a convex sidewall. In some embodiments, the etching process is an isotropic etching process that etches horizontally as well as vertically into the top surface 250t of the polish stop layer 250. Examples of the isotropic etching process may include wet etching.

Figure 4C:
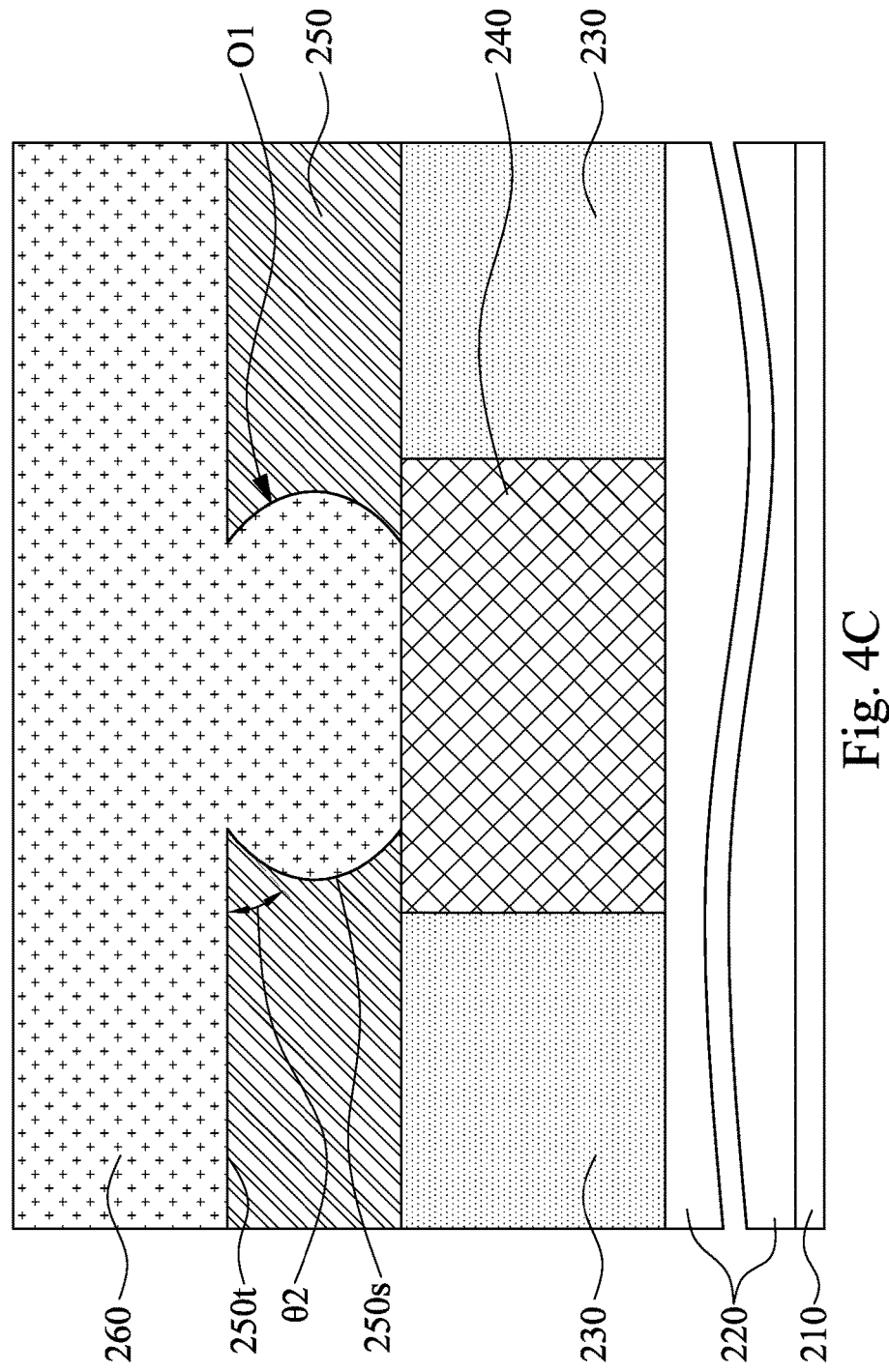

Returning to FIG. 3, the method M1 then proceeds to block S13 where a bottom electrode layer is formed into the opening of the polish stop layer. With reference to FIG. 4C, in some embodiments of block S13, the opening O1 in the polish stop layer 250 is overfilled with the bottom electrode layer 260. For example, the opening O1 in the polish stop layer 250 is filled up with a portion of the bottom electrode layer 260, and the top surface 250t of the polish stop layer 250 is capped with another portion of bottom electrode layer 260. The bottom electrode layer 260 may include platinum, aluminum-copper alloy, tantalum nitride, titanium nitride, titanium, tantanium, tungsten, tungsten nitride, copper, other suitable conductors, combinations thereof, or the like. The bottom electrode layer 260 is deposited using a physical vapor deposition (PVD) process, a plating process, or the like. In some cases, a liner or a diffusion barrier layer may be deposited first, followed by a deposition of the bulk material using one of the known deposition methods.

Figure 4D:
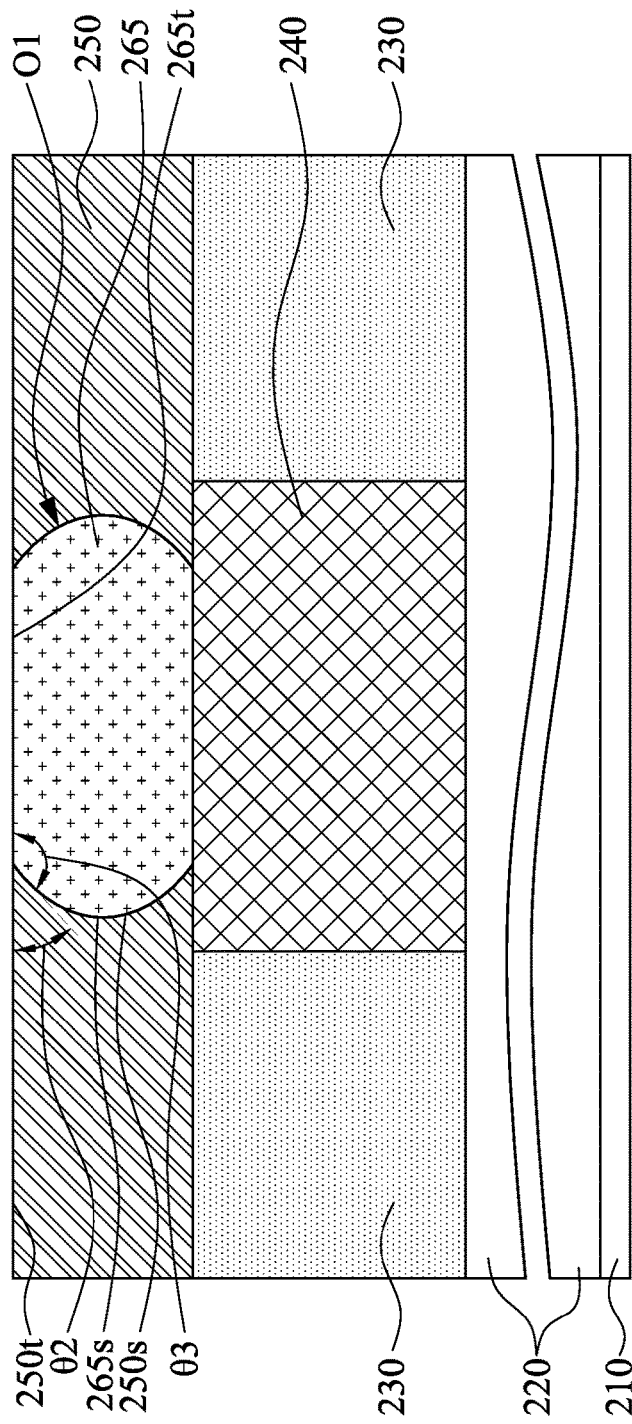

Returning to FIG. 3, the method M1 then proceeds to block S14 where a CMP process is performed to the bottom electrode layer until the polish stop layer is exposed. With reference to FIG. 4D, in some embodiments of block S14, a CMP process is carried out to remove excess materials of the bottom electrode layer 260 outside the opening O1 in the polish stop layer 250, while leaving a portion of the bottom electrode layer 260 in the opening O1 to serve as a bottom electrode 265.

CMP is a process that utilizes the reagent within slurry to react chemically with the front face of the wafer, and produce an easily polished layer. Herein, the front face of the wafer reacting with the slurry is top surface of the excess materials of the bottom electrode layer 260. Such slurry may contain some active polishing ingredients such as abrasive particles. Together with the abrasive action provided by the abrasive particles in the slurry under a polishing pad, the excess materials of the bottom electrode layer 260 are gradually removed.

In some embodiments, high-selectivity slurry (HSS), which has high selectivity between bottom electrode layer 260 and the polish stop layer 250, may be used in the polish process so that the determination of the polish end point is made clearer. That is, the polish stop layer 250 has a property relating to the CMP different from that of the bottom electrode layer 260, such that the polish stop layer 250 can slow down or even stop the CMP process. In some embodiments, the polish stop layer 250 has a higher resistance to the polishing than that of the bottom electrode layer 260. That is to say, in some embodiments, the polish stop layer 250 may have a greater hardness or a higher resistance to chemistries in the slurry than that of the bottom electrode layer 260. Therefore, the polish rate of the polish stop layer 250 is very slow compared to the polish rate of the bottom electrode layer 260. In this way, the CMP process is performed until the top surface of the polish stop layer 250 is exposed.

In some embodiments, conditions of the CMP is well controlled such that a top surface 265t of the bottom electrode 265 is substantially flush with (or level with) the top surface 250t of the polish stop layer 250. Moreover, the bottom electrode 265 has a sidewall 265s in contact with and conformal to the sidewall 250s of the opening O1 in the polish stop layer 250. As a result, the sidewall 265s of the bottom electrode 265 is convex and extends at an obtuse angle relative to the top surface 265t of the bottom electrode 265. For example, an included angle θ3 between the top surface 265t and the sidewall 265s of the bottom electrode 265 is greater than 90 degrees, which in turn will form a smooth top corner of the bottom electrode 265, which in turn will result in improved control of the RRAM cell, as discussed previously with respect to FIGS. 1 and 2.

Figure 4E:
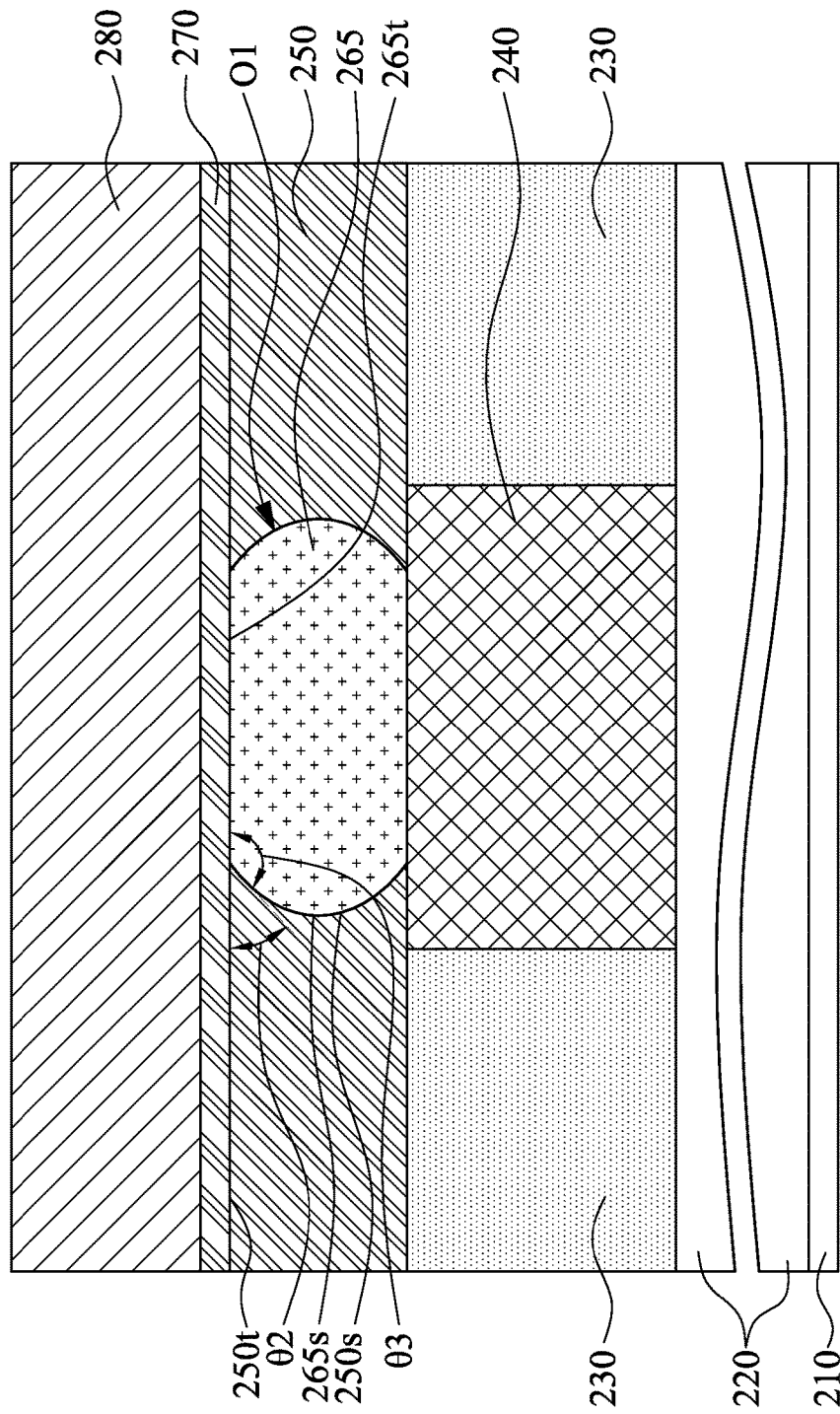

Returning to FIG. 3, the method M1 then proceeds to block S15 where a stack of a resistance switching layer and a top electrode layer is formed over the bottom electrode and the polish stop layer. With reference to FIG. 4E, in some embodiments of block S15, a resistance switching layer 270 and a top electrode layer 280 are formed in sequence over the bottom electrode 265 and the polish stop layer 250. The resistance switching layer 270 is a high-k dielectric layer that includes a metal oxide, which may be hafnium oxide, zinc oxide, zirconium oxide, aluminum oxide, nickel oxide, tantalum oxide, titanium oxide, tungsten oxide, molybdenum oxide, copper oxide, other oxides, combinations thereof, or the like. The metal oxide may have a non-stoichiometric oxygen to metal ratio. Depending on the method of deposition, the oxygen to metal ratio and other process conditions may be tuned to achieve specific dielectric layer properties. For example, a set of conditions may yield a low 'form' voltage and another set of conditions may yield a low 'read' voltage. The metal oxide may be deposited. In some embodiments, the metal oxide is a transition metal oxide. In other embodiments, the resistance switching layer 270 includes metal oxynitride.

The resistance switching layer 270 may be formed by a suitable technique, such as atomic layer deposition (ALD) with a precursor containing a metal and oxygen. Other chemical vapor deposition (CVD) techniques may be used. In other embodiments, the resistance switching layer 270 may be formed by a physical vapor deposition (PVD), such as a sputtering process with a metallic target and with a gas supply of oxygen and optionally nitrogen to the PVD chamber. In yet other embodiments, the resistance switching layer 270 may be formed using an electron-beam deposition process.

The top electrode layer 280 may be metal, metal-nitride, doped polysilicon, other suitable conductive material, combinations thereof, or the like. For example, the top electrode layer 280 may have the same material as the bottom electrode 265, such as platinum, aluminum-copper alloy, tantalum nitride, titanium nitride, titanium, tantanium, tungsten, tungsten nitride, copper, other suitable conductors, combinations thereof, or the like. The top electrode layer 280 may be formed by PVD, CVD including ALD, or other suitable technique.

Figure 4F:
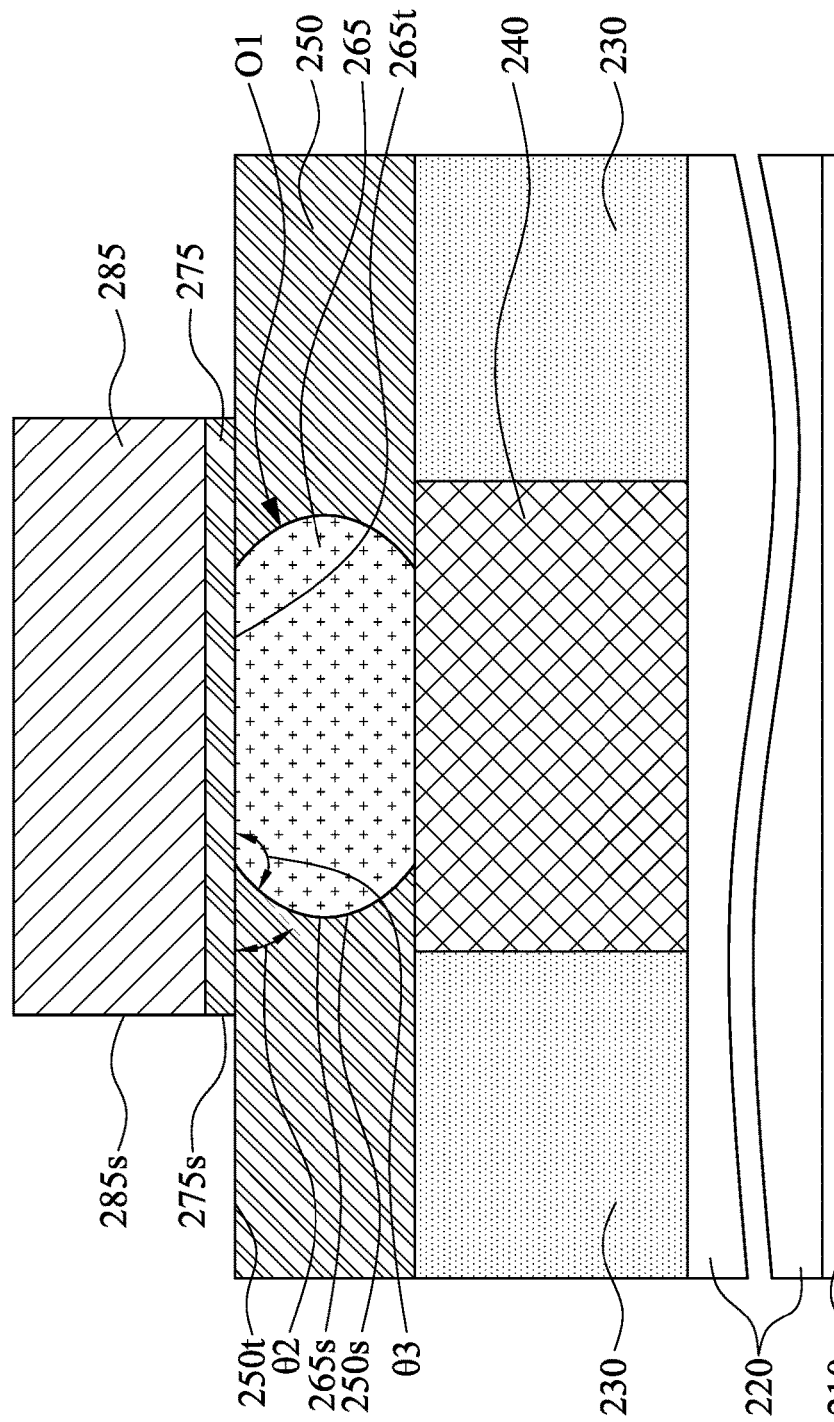

Returning to FIG. 3, the method M1 then proceeds to block S16 where the stack of the resistance switching layer and the top electrode layer is patterned. With reference to FIG. 4F, in some embodiments of block S16, the resistance switching layer 270 and the top electrode layer 280 are patterned to form a stack of a resistance switching layer 275 and a top electrode 285 over the bottom electrode 265. The bottom and top electrodes 265, 285, and the resistance switching layer 275 therebetween are in combination referred to as the MIM structure of RRAM cell, as discussed previously with respect to FIGS. 1 and 2. The patterning includes a photolithography operation where a photoresist is deposited, a pattern is defined by exposing photoresist to a radiation, and developing the photoresist to create a photoresist pattern. The photoresist pattern is then used as an etch mask to protect portions of the top electrode layer 280 and the underlying resistance switching layer 270. The patterning further includes one or more etching processes subsequent to the photolithography operation, such that portions of the top electrode layer 280 and resistance switching layer 270 not covered by the etch mask are removed by the one or more etching processes.

Because the bottom electrode 265 is shaped by the opening O1 in the polish stop layer 250, rather than by the patterning process performed to the stack of top electrode layer 280 and resistance switching layer 270, the sidewall 265s of the bottom electrode 265 may have a different shape than a sidewall 275s of the resistance switching layer 275 as well as a sidewall 285s of the top electrode 285. By way of example, the sidewalls 275s and 285s of the resistance switching layer 275 and the top electrode 285 are substantially straight, rather than convex. Moreover, the sidewalls 275s and 285s of the resistance switching layer 275 and the top electrode 285 are substantially flush with each other in some embodiments.

After formation of the MIM structure, another IMD layer is formed over the MIM structure and the polish stop layer 250, and a metallization structure (e.g. a combination of M5 and V5 as illustrated in FIGS. 1 and 2) is formed in the IMD layer to be in contact with the top electrode 285.

Figure 5:
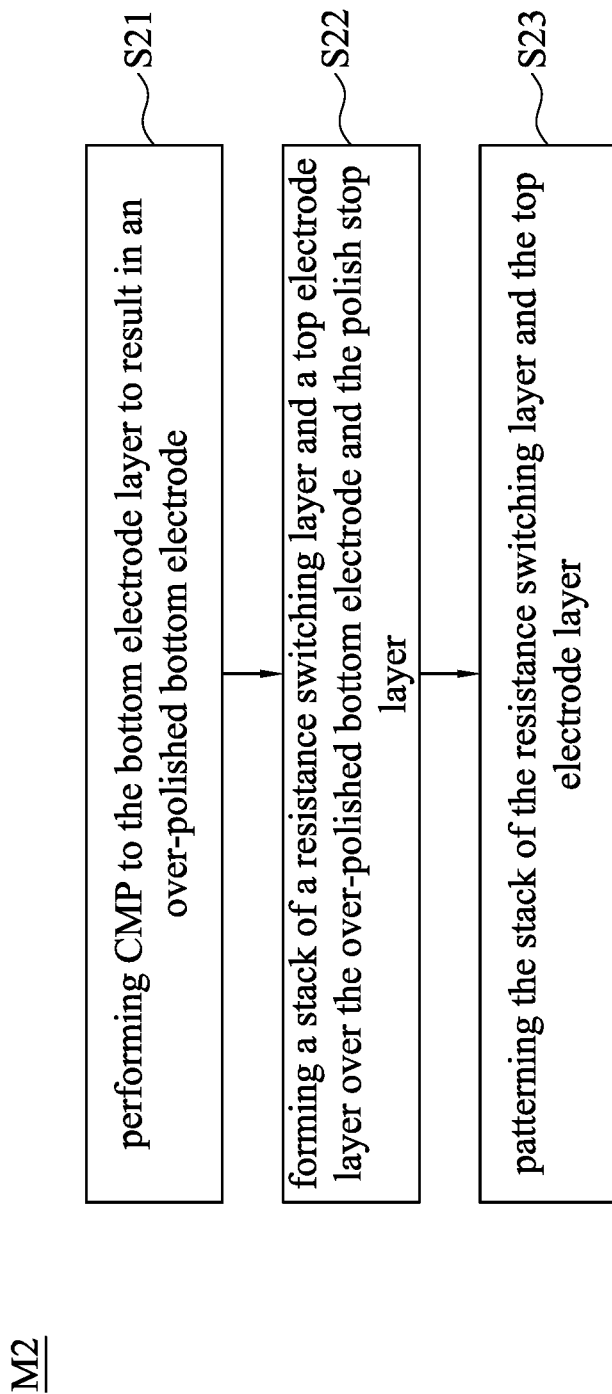
FIG. 5 is a flow chart of a method of forming a memory device in accordance with some embodiments.
Figure 6A:
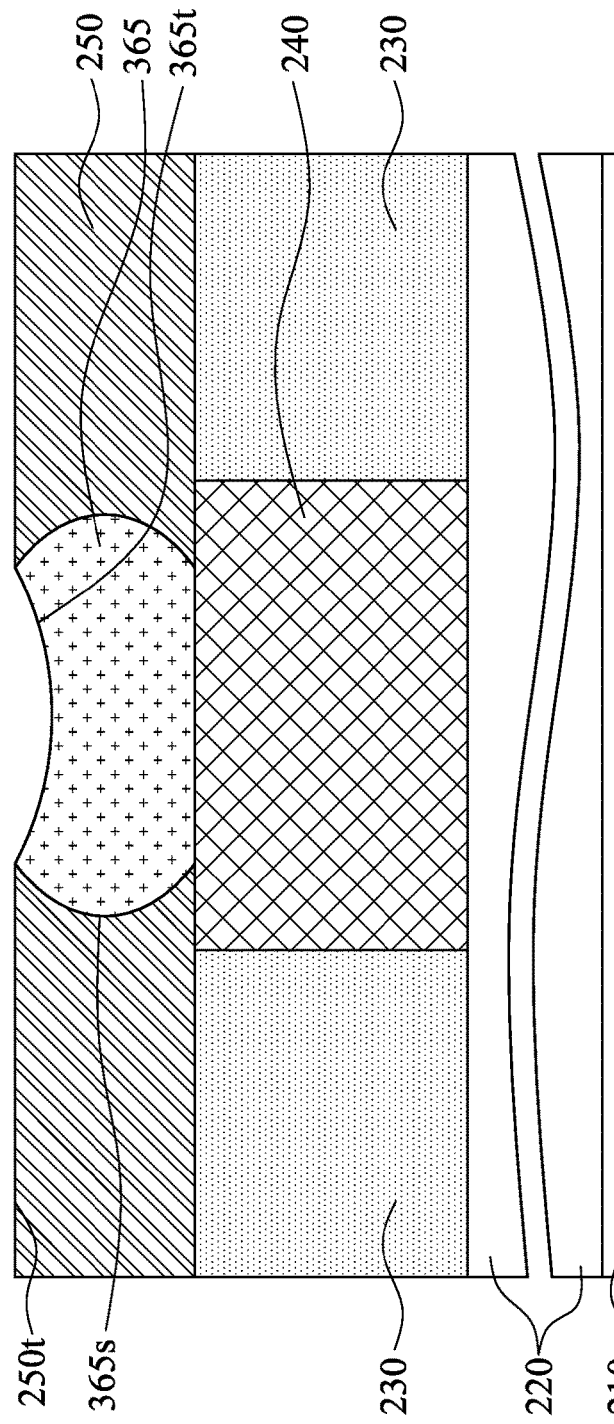
FIGS. 6A, 6B and 6C are cross-sectional views of the memory device at various stages of the method in FIG. 5 in accordance with some embodiments of the present disclosure.
Figure 6B:
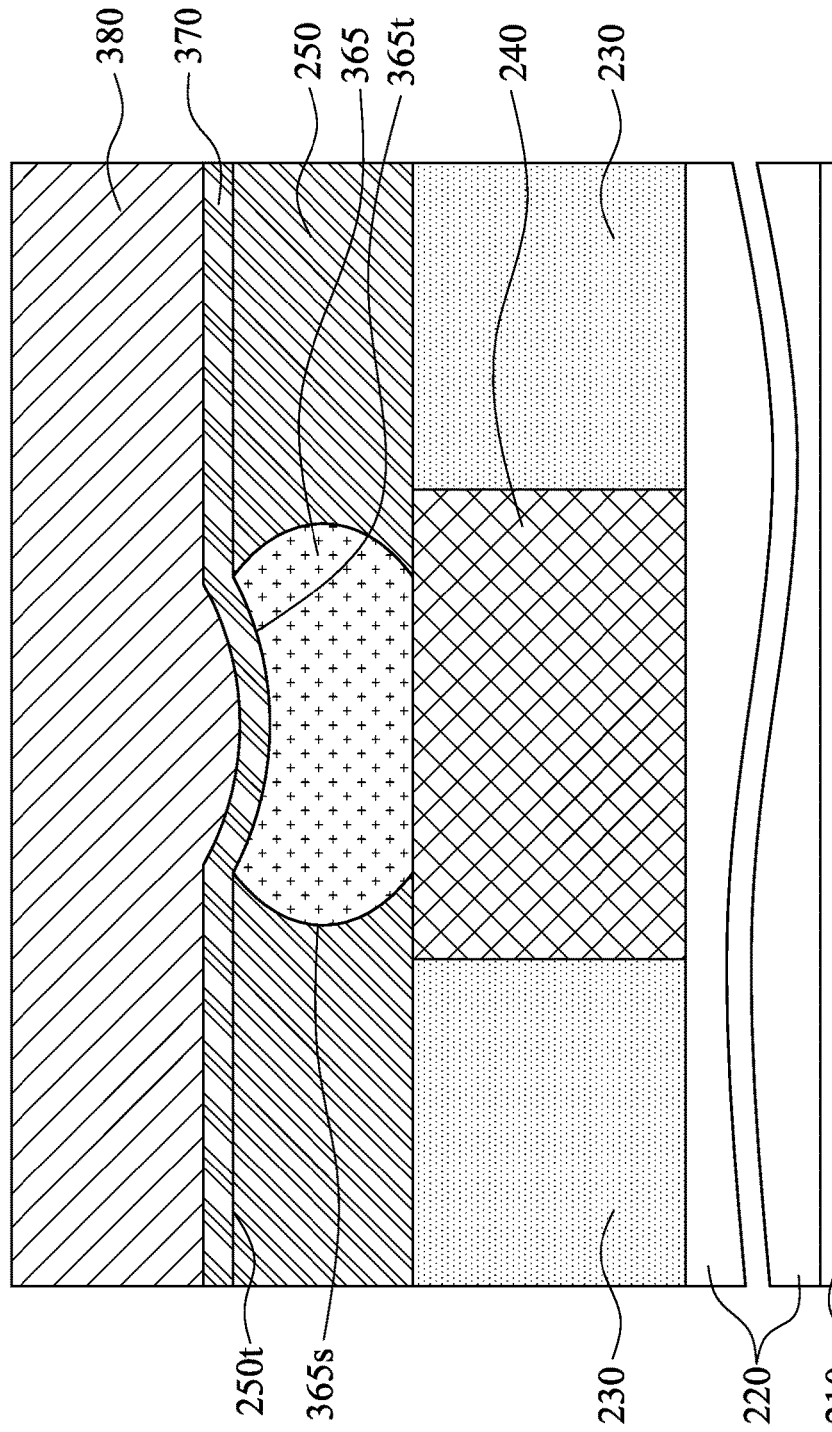
Figure 6C:
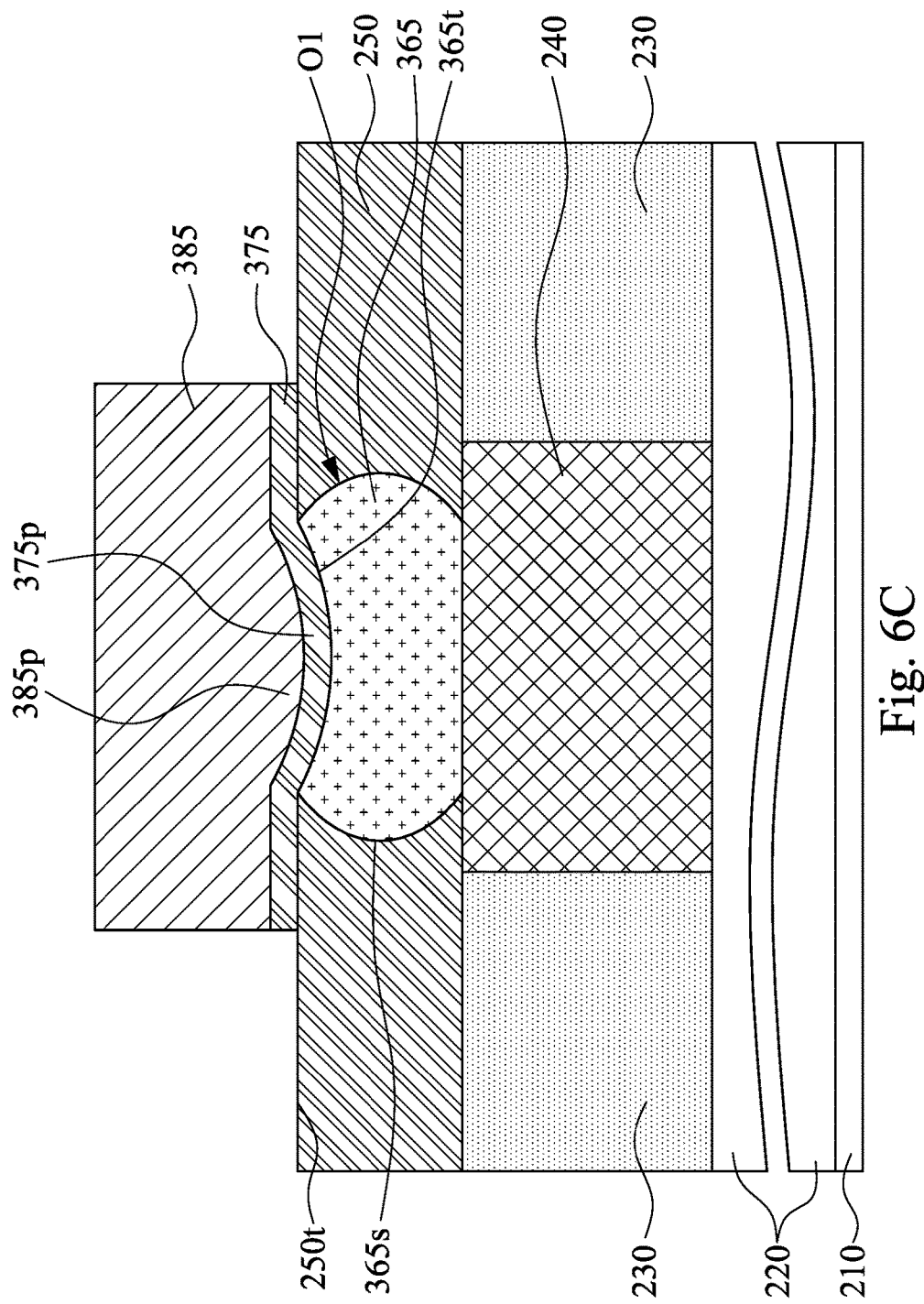

Referring now to FIG. 5, illustrated is a method M2 of forming a memory device in accordance with some embodiments, wherein a "dishing effect" occurs due to the CMP process of forming the bottom electrode. It is understood that parts of the method M2 and/or any of the exemplary metallization and dielectric layers discussed with reference to the method M2 may be fabricated by a BEOL process flow, and thus some processes are briefly described herein. FIGS. 6A, 6B and 6C are cross-sectional views of an SOC 300, which may be similar in many aspects to SOC 100, in various stages of fabrication in accordance with some embodiments of the present disclosure.

The method M2 begins at block S21 which may be performed following block S13 of the method M1. In block S21, a CMP process is performed to a bottom electrode layer (e.g. the bottom electrode layer 260 as illustrated in FIG. 4C) to result in an over-polished bottom electrode. With reference to FIG. 6A, in some embodiments of block S21, "over-polishing" or "dishing effect" occurs due to the nature of a CMP process, which in turn results in an over-polished bottom electrode 365 having a concave top surface 365t with a different shape than the top surface 250t of the polish stop layer 250. The concave top surface 365t would impede formation of a top corner with an obtuse angle. However, because the sidewall 365s of the bottom electrode 365 is convex as discussed previously with respect to the bottom electrode 265, the sidewall 365s of the bottom electrode 365 still extends at an obtuse angle relative to the concave top surface 365t of the bottom electrode 365. As a result, the unwanted leakage paths between the bottom electrode 365 and a subsequently formed top electrode can still be reduced, even if "over-polishing" or "dishing effect" occurs due to the nature of the CMP process.

Returning to FIG. 5, the method M2 then proceeds to block S22 where a where a stack of a resistance switching layer and a top electrode layer is formed over the over-polished bottom electrode and the polish stop layer. With reference to FIG. 6B, in some embodiments of block S22, a resistance switching layer 370 and a top electrode layer 380 are formed in sequence over the over-polished bottom electrode 365 and the polish stop layer 250. The resistance switching layer 370 is a high-k dielectric layer that includes a metal oxide, as discussed previously with respect to the resistance switching layer 270. The top electrode layer 380 is a metal layer as discussed previously with respect to the top electrode layer 280.

Returning to FIG. 5, the method M2 then proceeds to block S23 where the stack of the resistance switching layer and the top electrode layer is patterned. With reference to FIG. 6C, in some embodiments of block S23, the resistance switching layer 370 and the top electrode layer 380 are patterned to form a stack of a resistance switching layer 375 and a top electrode 385 over the over-polished bottom electrode 365. The bottom and top electrodes 365, 385, and the resistance switching layer 375 therebetween are in combination referred to as the MIM structure of RRAM cell, as discussed previously with respect to FIGS. 1 and 2. In some embodiments, the resistance switching layer 375 is conformal to the bottom electrode 365 and thus has a curved portion 375p in contact with the concave top surface 365t of the bottom electrode 365. In further embodiments, the top electrode 385 has a protrusion 385p embedded in the curved portion 375p.

Figure 7:
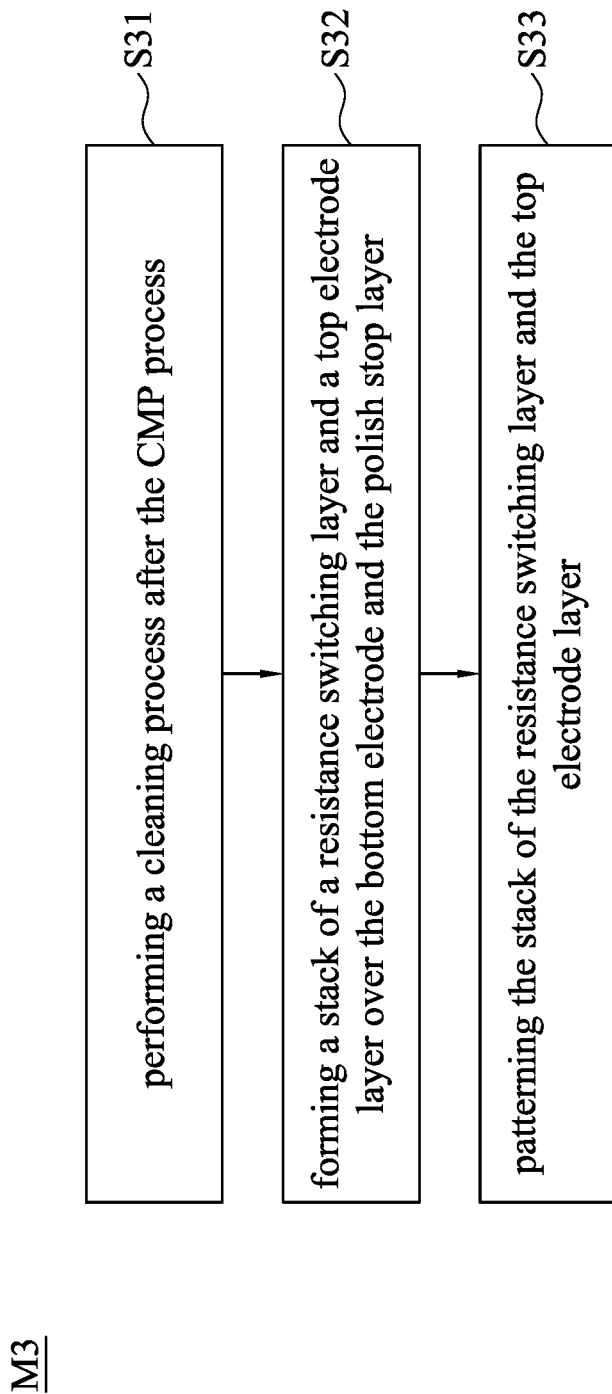
FIG. 7 is a flow chart of a method of forming a memory device in accordance with some embodiments.
Figure 8A:
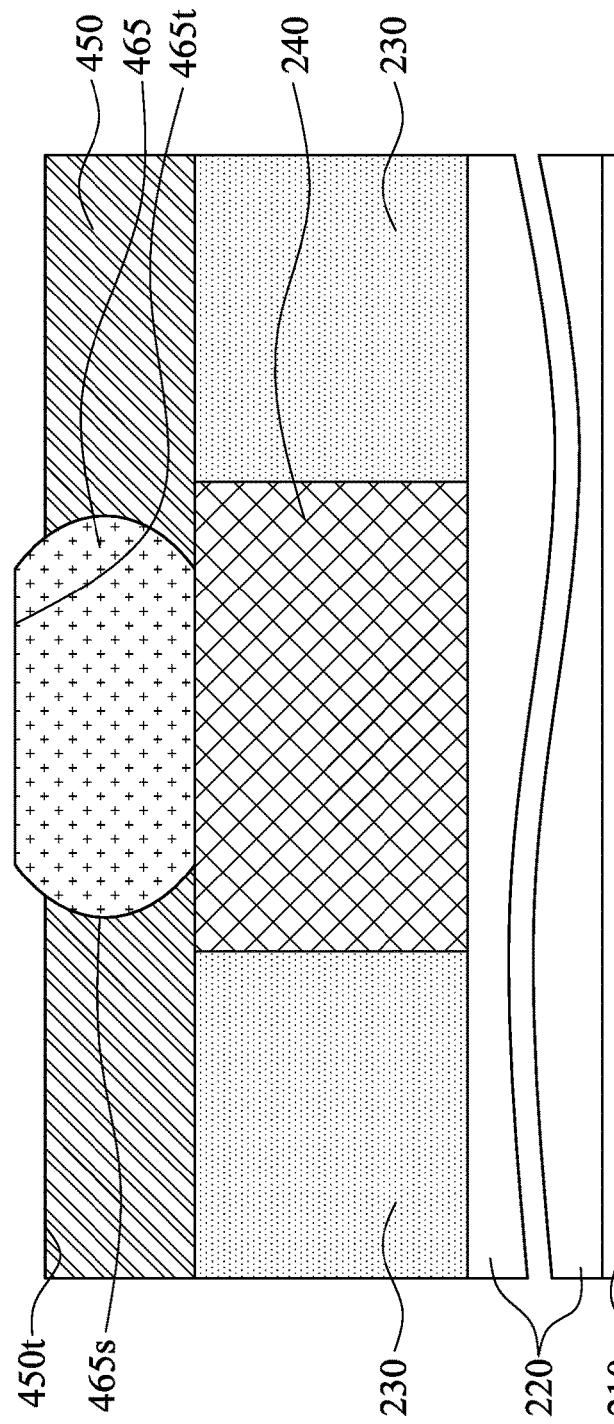
FIGS. 8A, 8B and 8C are cross-sectional views of the memory device at various stages of the method in FIG. 7 in accordance with some embodiments of the present disclosure.
Figure 8B:
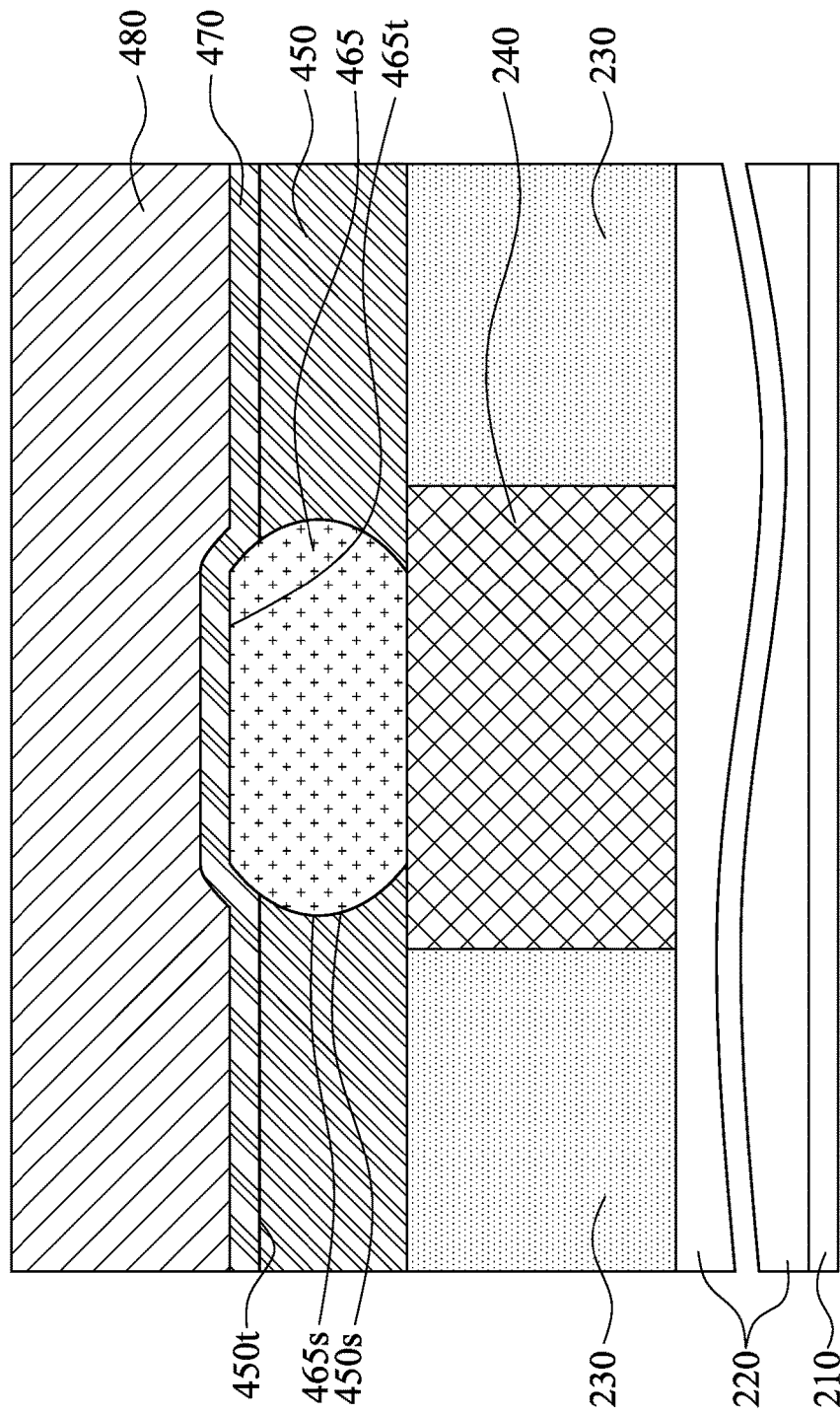
Figure 8C:
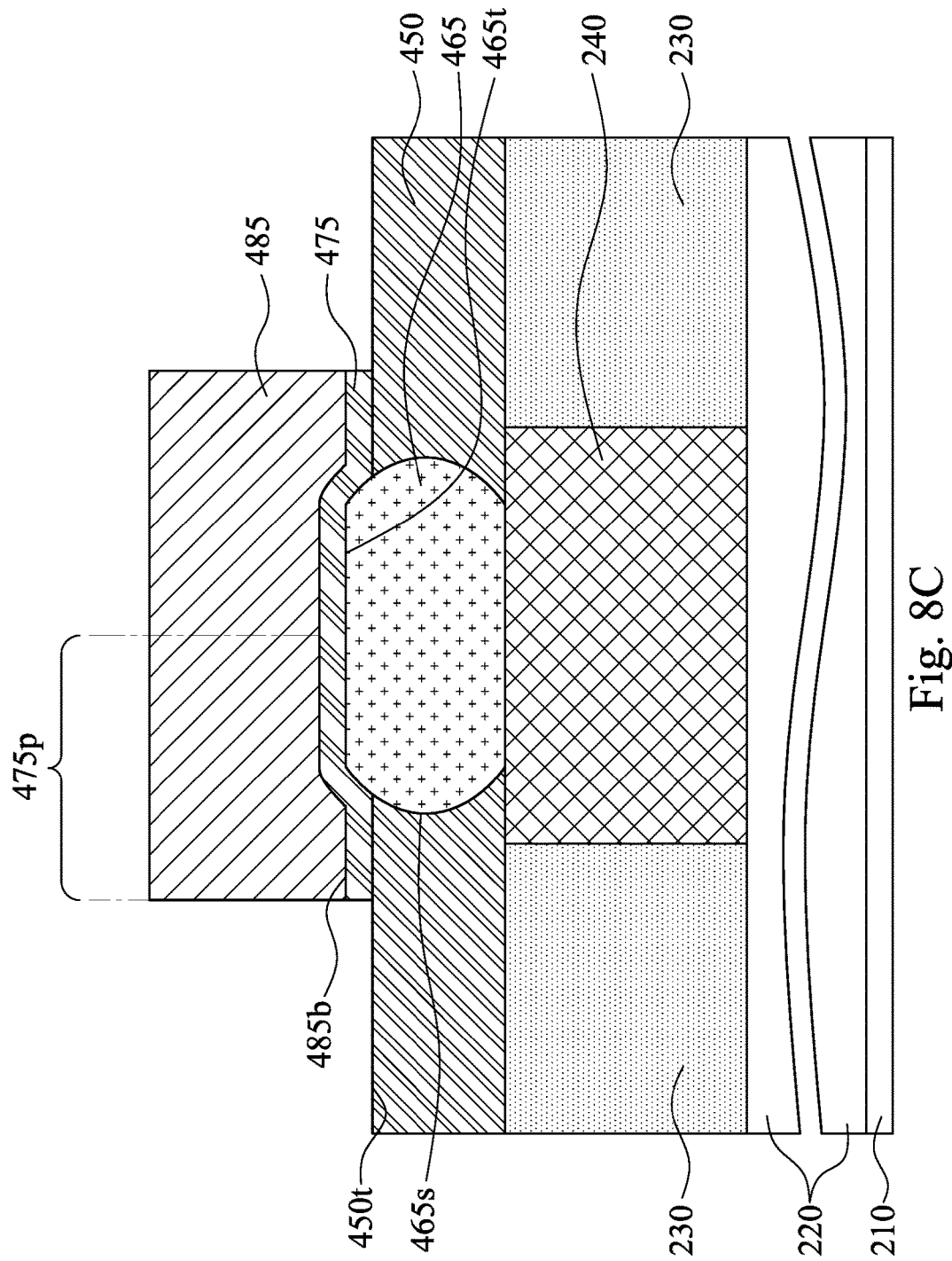

Referring now to FIG. 7, illustrated is a method M3 of forming a memory device in accordance with some embodiments, wherein a cleaning process is involved after the CMP process. It is understood that parts of the method M3 and/or any of the exemplary metallization and dielectric layers discussed with reference to the method M3 may be fabricated by a BEOL process flow, and thus some processes are briefly described herein. FIGS. 8A, 8B and 8C are cross-sectional views of an SOC 400, which may be similar in many aspects to SOC 100, in various stages of fabrication in accordance with some embodiments of the present disclosure.

The method M3 begins at block S31 which may be performed following block S14 of the method M1. In block S31, a cleaning process is performed to the polished surface after the CMP process. With reference to FIG. 8A, in some embodiments of block 31, de-ionized water or the like may be used to clear away residue from the CMP process, such as the slurry and abrasive particles on the polished surfaces of the polish stop layer 450 and of the bottom electrode 465. The cleaning process may result in thinning down the polish stop layer 450, which in turn may lead to a step height between the top surface 450t of the polish stop layer 450 and the top surface 465t of the bottom electrode 465. Such a step height would result in a resistance switching layer coated around a sharp corner of the bottom electrode. However, because the sidewall 465s of the bottom electrode 465 is convex as discussed previously with respect to the bottom electrode 265, the sidewall 465s of the bottom electrode 465 still extends at an obtuse angle relative to the top surface 465t of the bottom electrode 465. As a result, a subsequently formed resistance switching layer 470 will be coated around a smooth top corner, rather than a sharp top corner. Therefore, the unwanted leakage paths between the bottom electrode 465 and a subsequently formed top electrode can still be reduced, even if the cleaning process leads to a step height between the bottom electrode 465 and the polish stop layer 450.

Returning to FIG. 7, the method M3 then proceeds to block S32 where a where a stack of a resistance switching layer and a top electrode layer is formed over the bottom electrode and the polish stop layer. With reference to FIG. 8B, in some embodiments of block S32, a resistance switching layer 470 and a top electrode layer 480 are formed in sequence over the bottom electrode 465 and the polish stop layer 450. The resistance switching layer 470 is a high-k dielectric layer that includes a metal oxide, as discussed previously with respect to the resistance switching layer 270. The top electrode layer 480 is a metal layer as discussed previously with respect to the top electrode layer 280.

Returning to FIG. 7, the method M3 then proceeds to block S33 where the stack of the resistance switching layer and the top electrode layer is patterned. With reference to FIG. 8C, in some embodiments of block S23, the resistance switching layer 470 and the top electrode layer 480 are patterned to form a stack of a resistance switching layer 475 and a top electrode 485 over the bottom electrode 465. The bottom and top electrodes 465, 485, and the resistance switching layer 475 therebetween are in combination referred to as the MIM structure of RRAM cell, as discussed previously with respect to FIGS. 1 and 2. In some embodiments, the resistance switching layer 475 is conformal to the bottom electrode 465 and the polish stop layer 450, and hence the resistance switching portion 475 has a stepped portion 475p extending from the top surface 450t of the polish stop layer 450 to the top surface 465t of the bottom electrode 465. In further embodiments, the top electrode 485 has a stepped bottom surface 485b in contact with and conformal to the stepped portion 475p of the resistance switching layer 475.

Figure 9:
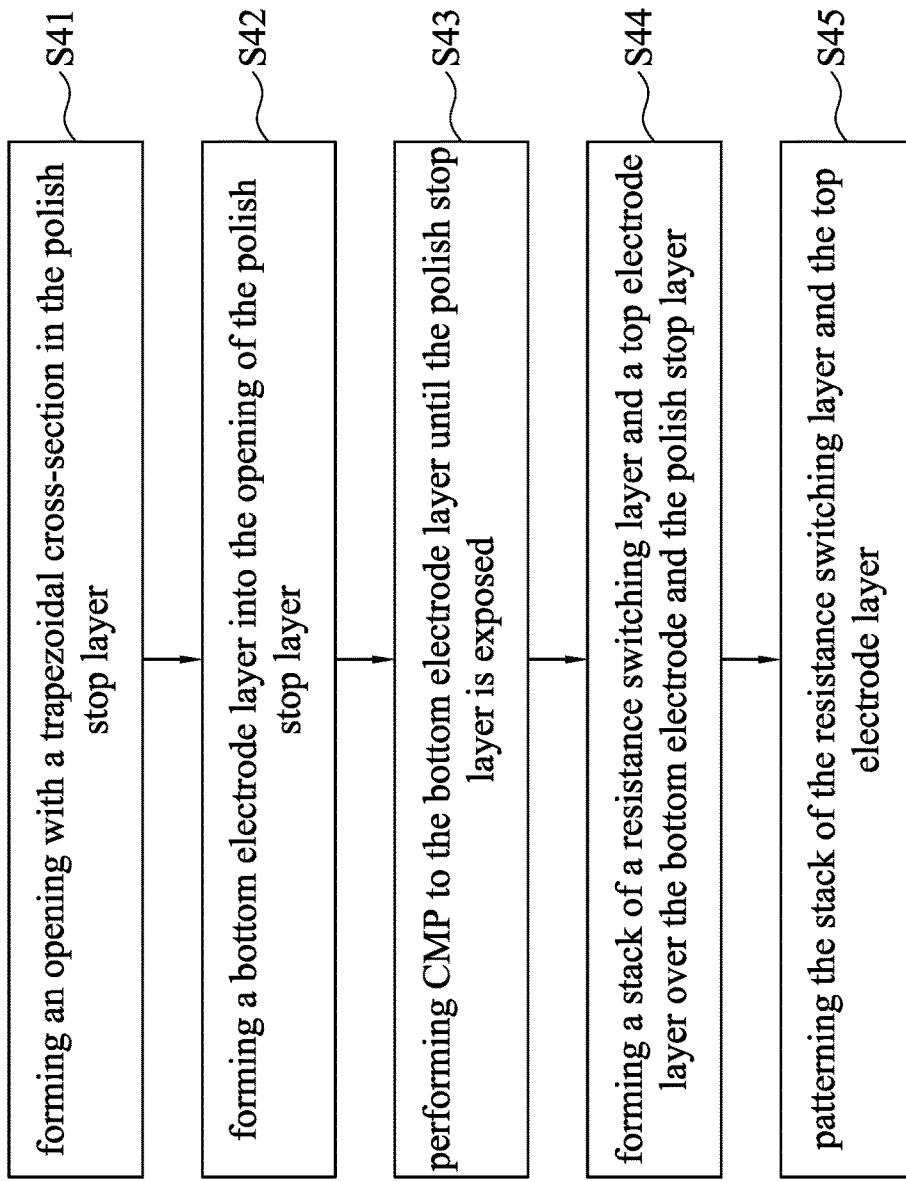
FIG. 9 is a flow chart of a method of forming a memory device in accordance with some embodiments.

Referring now to FIG. 9, illustrated is a method M4 of forming a memory device in accordance with some embodiments, wherein the memory device has a trapezoidal bottom electrode. It is understood that parts of the method M4 and/or any of the exemplary metallization and dielectric layers discussed with reference to the method M4 may be fabricated by a BEOL process flow, and thus some processes are briefly described herein. FIGS. 10A, 10B, 10C, 10D and 10E are cross-sectional views of an SOC 500, which may be similar in many aspects to SOC 100, in various stages of fabrication in accordance with some embodiments of the present disclosure.

Figure 10A:
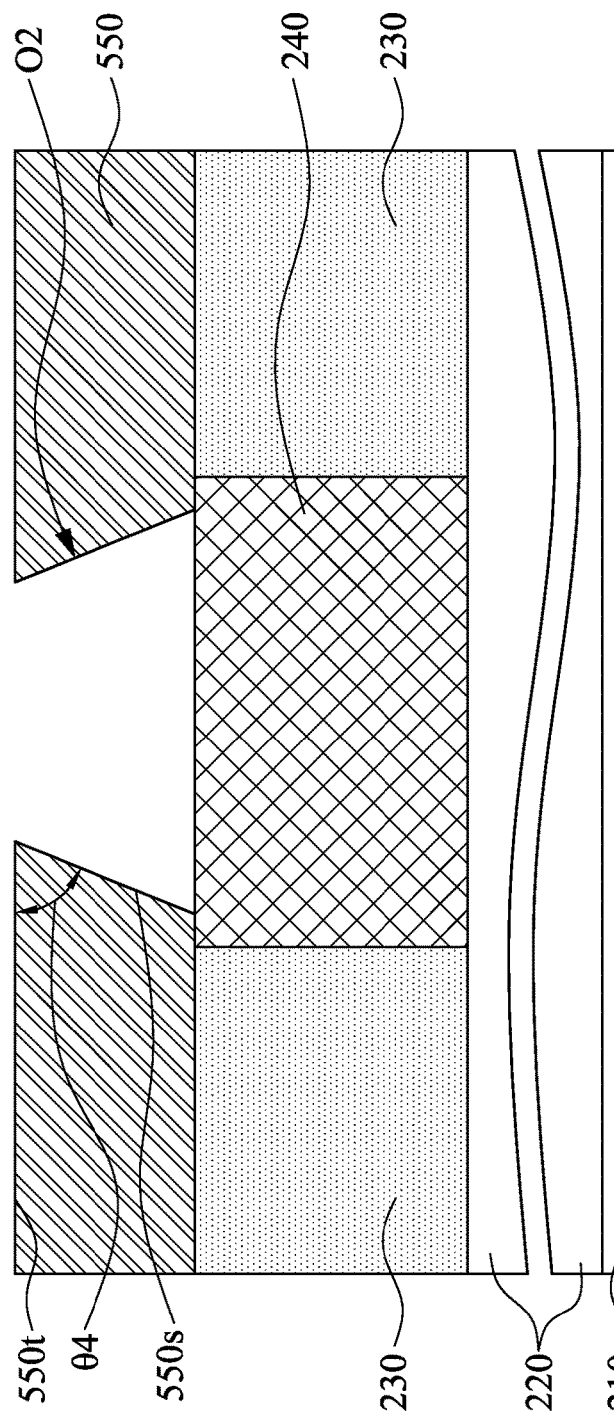
FIGS. 10A, 10B, 10C, 10D and 10E are cross-sectional views of the memory device at various stages of the method in FIG. 9 in accordance with some embodiments of the present disclosure.

The method M4 begins at block S41 which may be performed following block S11 of the method M1. In block S41, an opening having a trapezoidal cross-section is formed in the polish stop layer. With reference to FIG. 10A, in some embodiments of block S41, an etch process is carried out to the polish stop layer 550 to form an opening O2 until the metal structure 240 is exposed. Conditions of the etch process is selected such that a sidewall 550s of the opening O2 is sloped with respect to the top surface 550t of the polish stop layer 550 and extends at an acute angle relative to the top surface 550t of the polish stop layer 550. For example, an included angle θ4 between the top surface 550t of the polish stop layer 550 and the sidewall 550s of the opening O1 is less than 90 degrees. In this way, the opening O2 has a trapezoidal cross-section. In some embodiments, the etching process may be dry etching, wet etching, or combinations thereof.

Figure 10B:
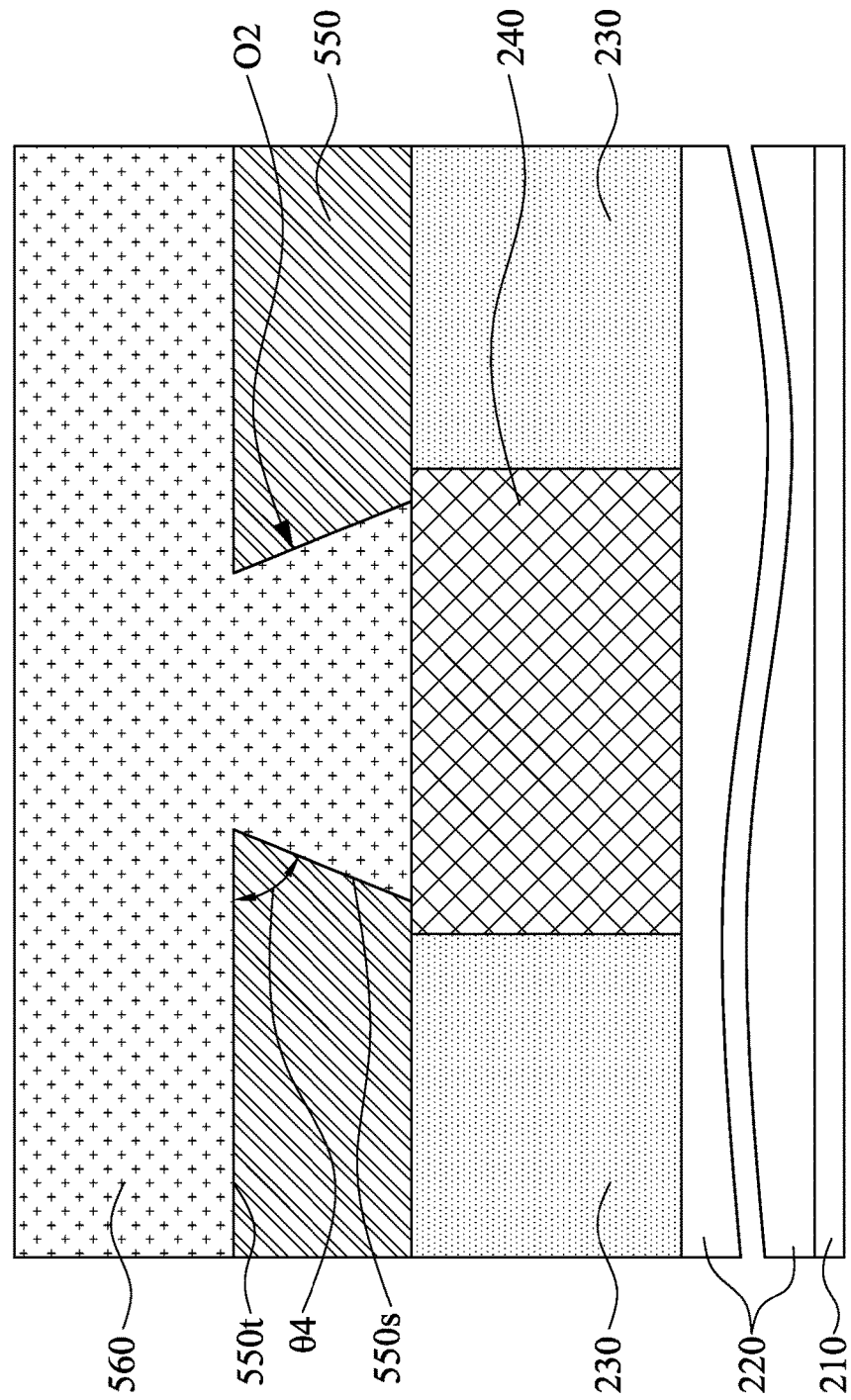

Returning to FIG. 9, the method M4 then proceeds to block S42 where a bottom electrode layer is formed into the opening of the polish stop layer. With reference to FIG. 10B, in some embodiments of block S42, the opening O2 in the polish stop layer 550 is overfilled with the bottom electrode layer 560. For example, the opening O2 in the polish stop layer 550 is filled up with a portion of the bottom electrode layer 560, and the top surface 550t of the polish stop layer 550 is capped with another portion of bottom electrode layer 560. Materials and fabrication of the bottom electrode layer 560 is similar as discussed previously with respect to the bottom electrode layer 260.

Figure 10C:
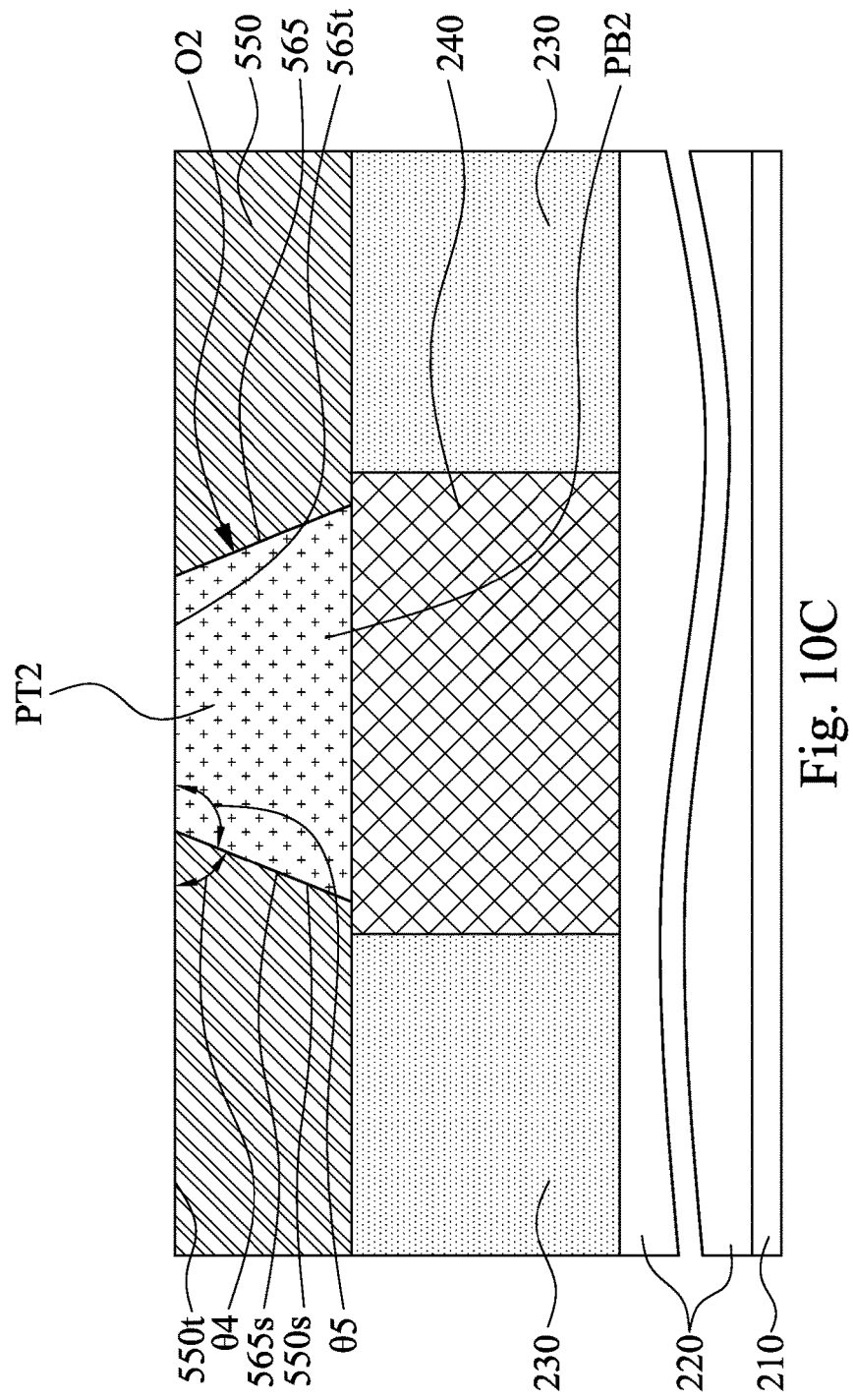

Returning to FIG. 9, the method M4 then proceeds to block S43 where a CMP process is performed to the bottom electrode layer until the polish stop layer is exposed. With reference to FIG. 10C, in some embodiments of block S43, a CMP process is carried out to remove excess materials of the bottom electrode layer 560 outside the opening O2 in the polish stop layer 550, while leaving a portion of the bottom electrode layer 560 in the opening O2 to serve as a bottom electrode 565. In some embodiments, the bottom electrode 565 has a sidewall 565s in contact with and conformal to the sloped sidewall 550s of the opening O2 in the polish stop layer 550. As a result, the sidewall 565s of the bottom electrode 565 is also sloped and extends at an obtuse angle relative to the top surface 565t of the bottom electrode 565. For example, an included angle θ5 between the top surface 565t and the sidewall 565s of the bottom electrode 565 is greater than 90 degrees, which in turn will form a smooth top corner of the bottom electrode 565, which in turn will result in improved control of the RRAM cell, as discussed previously with respect to FIGS. 1 and 2.

Figure 10D:
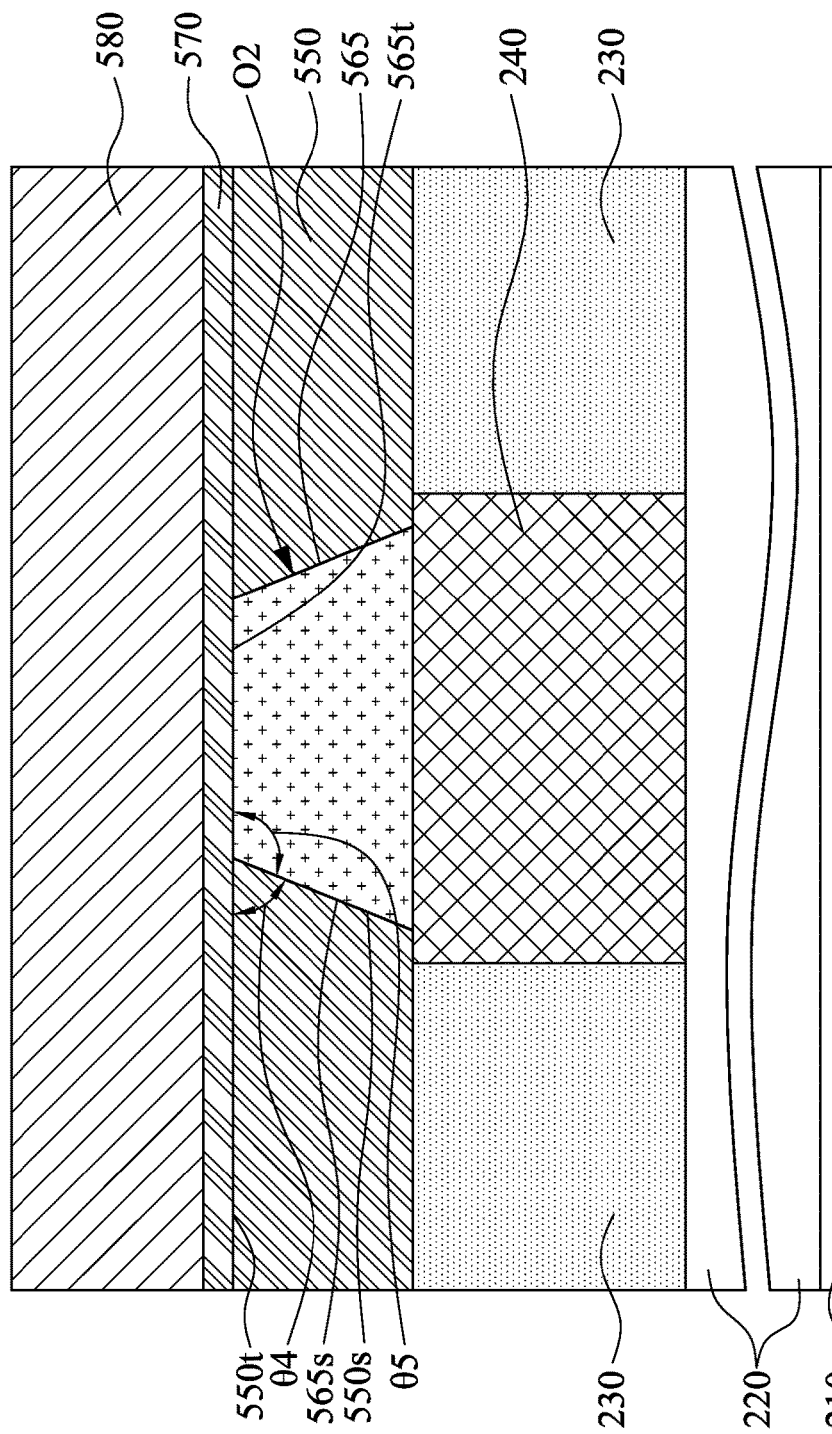

As illustrated in FIG. 10C, in some embodiments, the bottom electrode 565 is trapezoidal because it fills the opening O2 with a trapezoidal cross-section. In further embodiments, the sidewall 565s of the bottom electrode 565 has a slope substantially the same as a slope of the sidewall 550s of the opening O2 in the polish stop layer 550. In some embodiments, the bottom electrode 565 includes a top portion PT2 and a bottom portion PB2 between the top portion PT2 and the metal structure 240. The top and bottom portions PT2 and PB2 are trapezoidal and taper along the same direction. For example, the top and bottom portions PT2 and PB2 taper away from the metal structure 240. Stated in another way, the top and bottom portions PT2 and PB2 taper towards a resistance switching layer (e.g. the resistance switching layer 570 as shown in FIG. 10D). The taper profile of the top portion PT2 would result in an obtuse included angle θ5 between the top surface 565t and the sidewall 565s of the bottom electrode 565, which in turn will be advantageous for reduction of unwanted leakage paths between the bottom electrode 565 and a subsequently formed top electrode.

Returning to FIG. 9, the method M4 then proceeds to block S44 where a where a stack of a resistance switching layer and a top electrode layer is formed over the over-polished bottom electrode and the polish stop layer. With reference to FIG. 10D, in some embodiments of block S44, a resistance switching layer 570 and a top electrode layer 580 are formed in sequence over the trapezoidal bottom electrode 565 and the polish stop layer 550. The resistance switching layer 570 is a high-k dielectric layer that includes a metal oxide, as discussed previously with respect to the resistance switching layer 270. The top electrode layer 580 is a metal layer as discussed previously with respect to the top electrode layer 280.

Figure 10E:
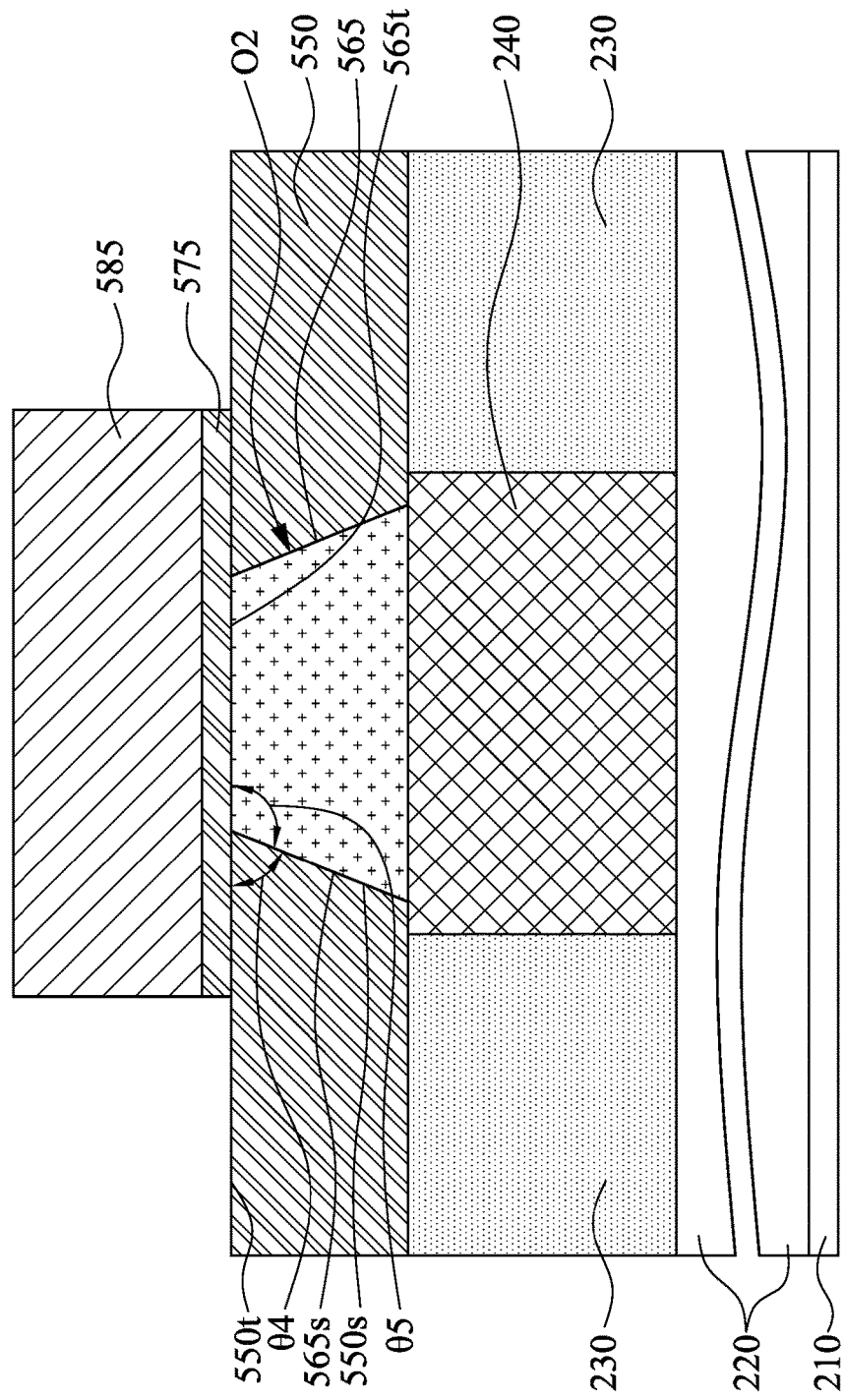

Returning to FIG. 9, the method M4 then proceeds to block S45 where the stack of the resistance switching layer and the top electrode layer is patterned. With reference to FIG. 10E, in some embodiments of block S45, the resistance switching layer 570 and the top electrode layer 580 are patterned to form a stack of a resistance switching layer 575 and a top electrode 585 over the trapezoidal bottom electrode 565. The bottom and top electrodes 565, 585, and the resistance switching layer 575 therebetween are in combination referred to as the MIM structure of RRAM cell, as discussed previously with respect to FIGS. 1 and 2.

Figure 11:
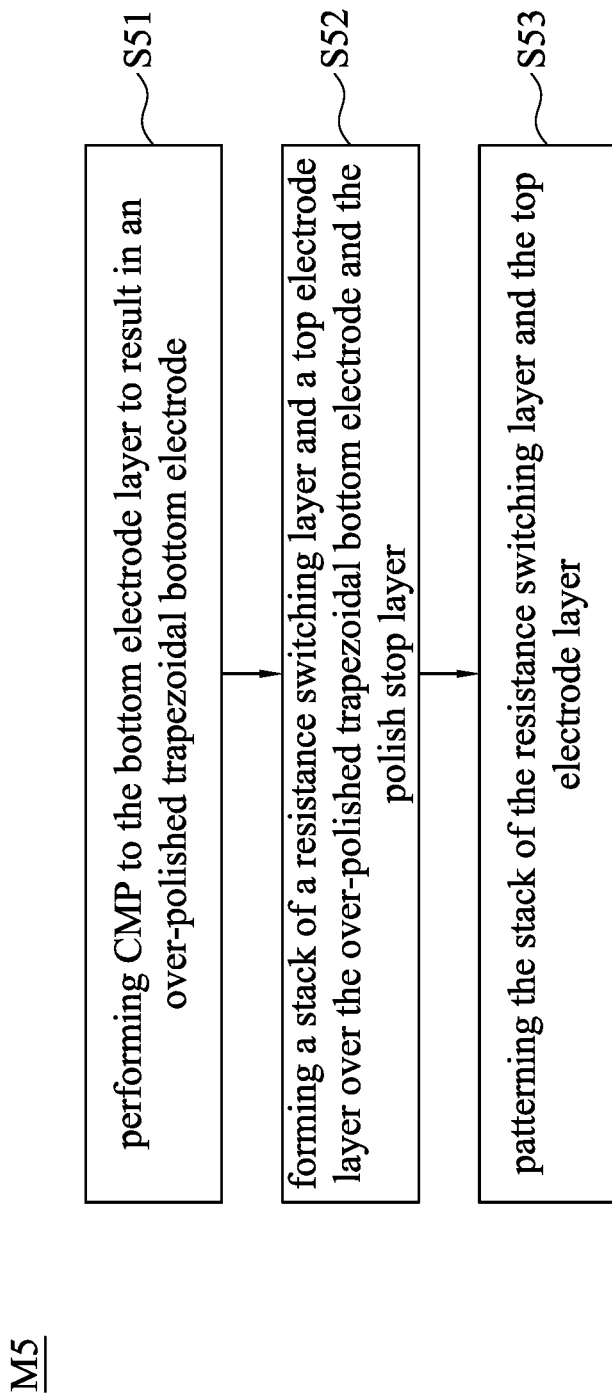
FIG. 11 is a flow chart of a method of forming a memory device in accordance with some embodiments.
Figure 12A:
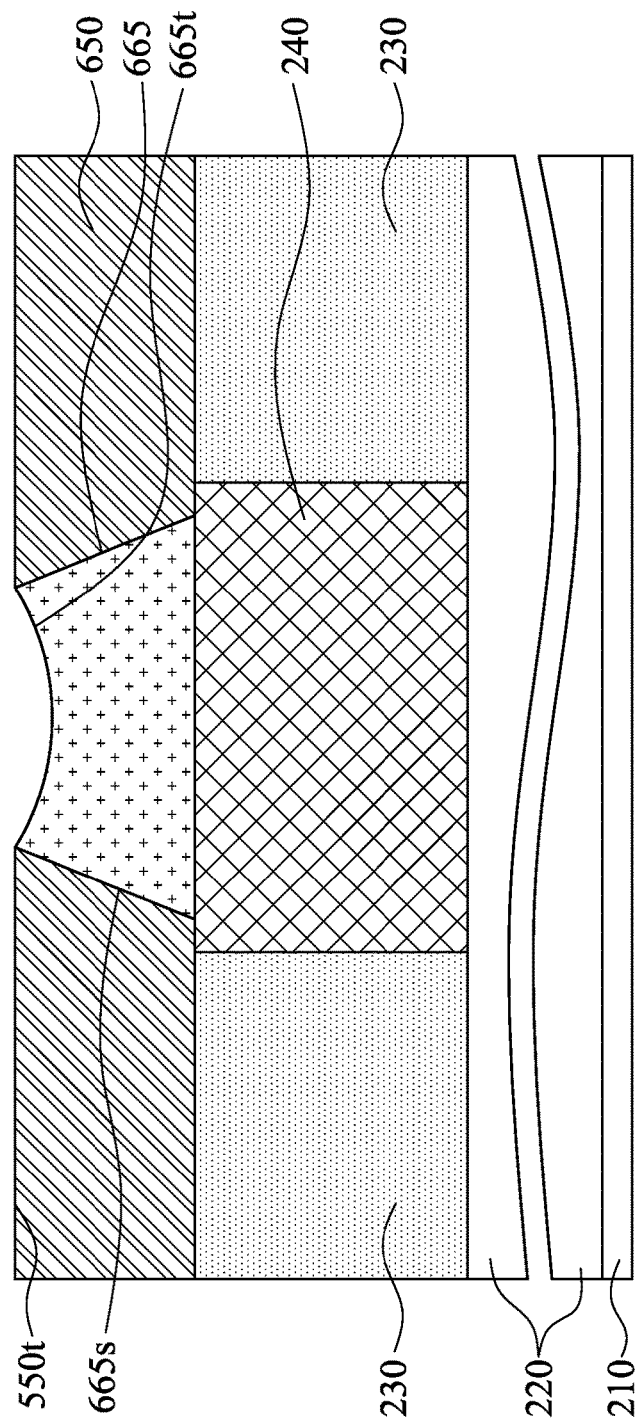
FIGS. 12A, 12B and 12C are cross-sectional views of the memory device at various stages of the method in FIG. 11 in accordance with some embodiments of the present disclosure.
Figure 12B:
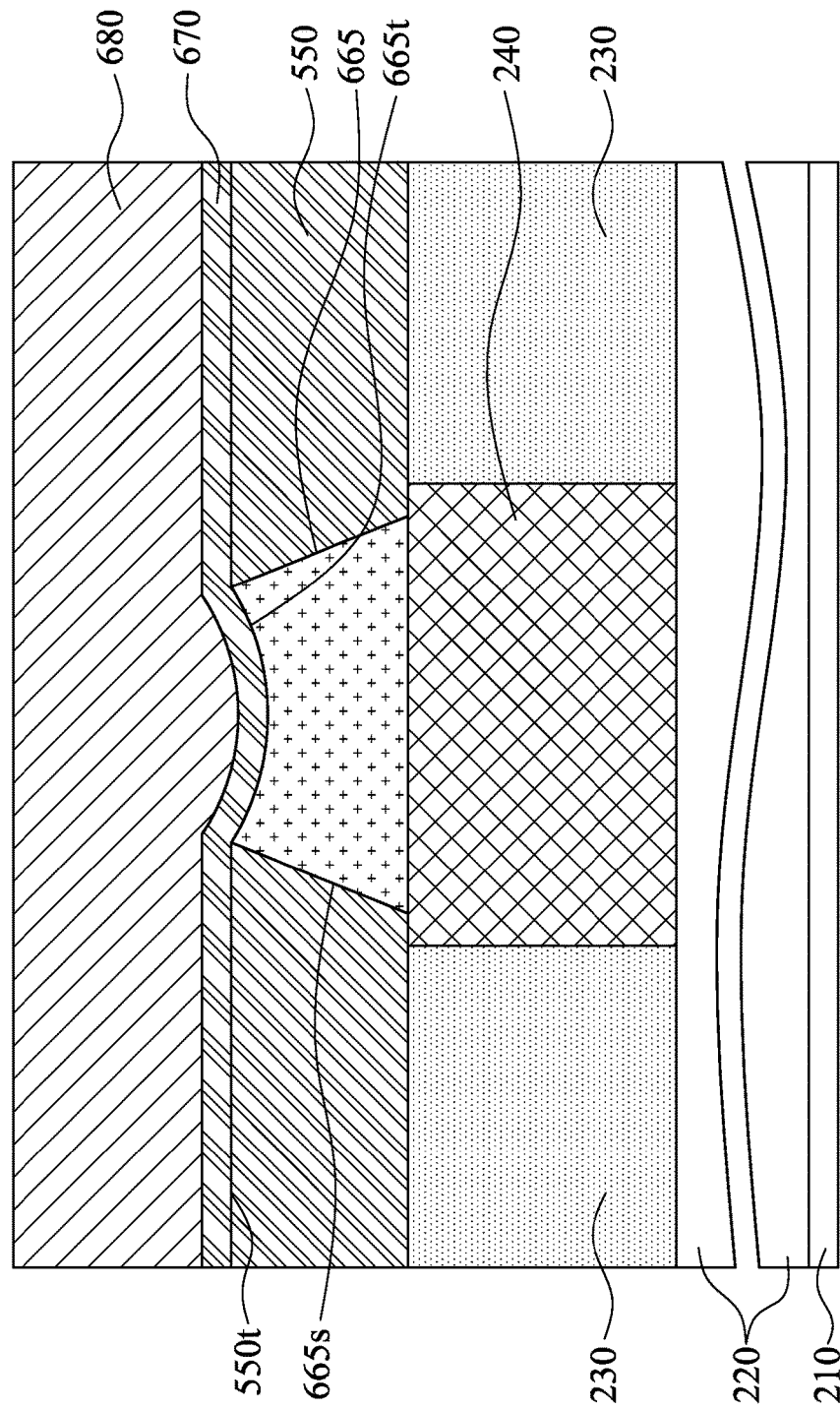
Figure 12C:
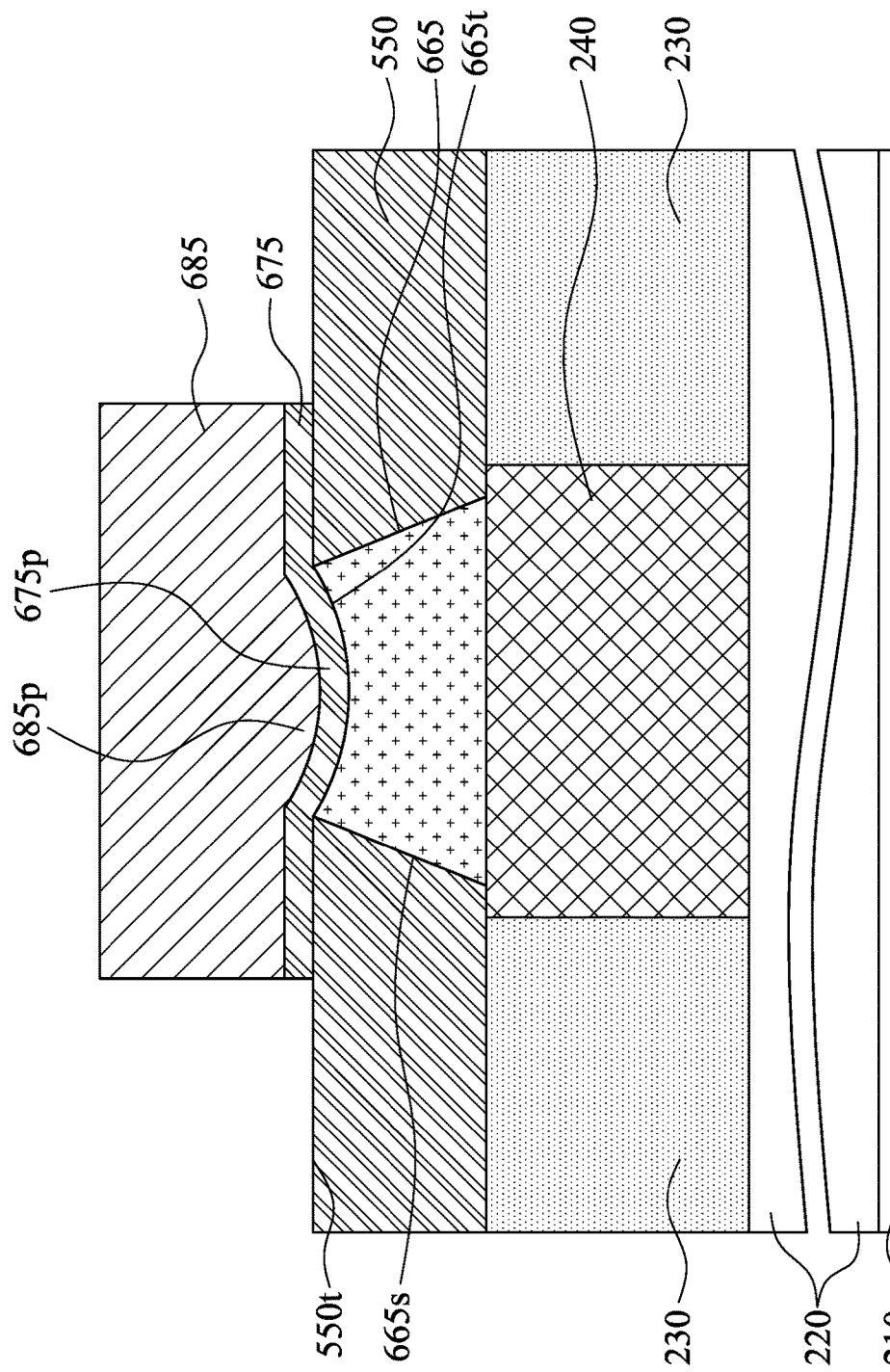

Referring now to FIG. 11, illustrated is a method M5 of forming a memory device in accordance with some embodiments, wherein a dishing effect occurs during the CMP process performed to the bottom electrode layer. It is understood that parts of the method M5 and/or any of the exemplary metallization and dielectric layers discussed with reference to the method M5 may be fabricated by a BEOL process flow, and thus some processes are briefly described herein. FIGS. 12A, 12B and 12C are cross-sectional views of an SOC 600, which may be similar in many aspects to SOC 100, in various stages of fabrication in accordance with some embodiments of the present disclosure.

The method M5 begins at block S21 which may be performed following block S42 of the method M4. In block S51, a CMP process is performed to a bottom electrode layer (e.g. the bottom electrode layer 560 as illustrated in FIG. 10B) to result in an over-polished bottom electrode. With reference to FIG. 12A, in some embodiments of block S51, "over-polishing" or "dishing effect" occurs due to the nature of a CMP process, which in turn results in an over-polished bottom electrode 665 having a concave top surface 665t with a different shape than the top surface 550t of the polish stop layer 550. The concave top surface 665t would impede formation of a top corner with an obtuse angle. However, because the sidewall 665s of the bottom electrode 665 is sloped as discussed previously with respect to the bottom electrode 565, the sidewall 665s of the bottom electrode 665 still extends at an obtuse angle relative to the concave top surface 665t of the bottom electrode 665. As a result, the unwanted leakage paths between the bottom electrode 665 and a subsequently formed top electrode can still be reduced, even if "over-polishing" or "dishing effect" occurs due to the nature of the CMP process.

Returning to FIG. 11, the method M5 then proceeds to block S52 where a where a stack of a resistance switching layer and a top electrode layer is formed over the over-polished bottom electrode and the polish stop layer. With reference to FIG. 12B, in some embodiments of block S52, a resistance switching layer 670 and a top electrode layer 680 are formed in sequence over the over-polished bottom electrode 665 and the polish stop layer 550. The resistance switching layer 670 is a high-k dielectric layer that includes a metal oxide, as discussed previously with respect to the resistance switching layer 270. The top electrode layer 680 is a metal layer as discussed previously with respect to the top electrode layer 280.

Returning to FIG. 11, the method M5 then proceeds to block S53 where the stack of the resistance switching layer and the top electrode layer is patterned. With reference to FIG. 12C, in some embodiments of block S53, the resistance switching layer 670 and the top electrode layer 680 are patterned to form a stack of a resistance switching layer 675 and a top electrode 685 over the over-polished bottom electrode 365. The bottom and top electrodes 665, 685, and the resistance switching layer 675 therebetween are in combination referred to as the MIM structure of RRAM cell, as discussed previously with respect to FIGS. 1 and 2. In some embodiments, the resistance switching layer 675 is conformal to the bottom electrode 665 and thus has a curved portion 675p in contact with the concave top surface 665t of the bottom electrode 665. In further embodiments, the top electrode 685 has a protrusion 685p embedded in the curved portion 675p.

Figure 13:
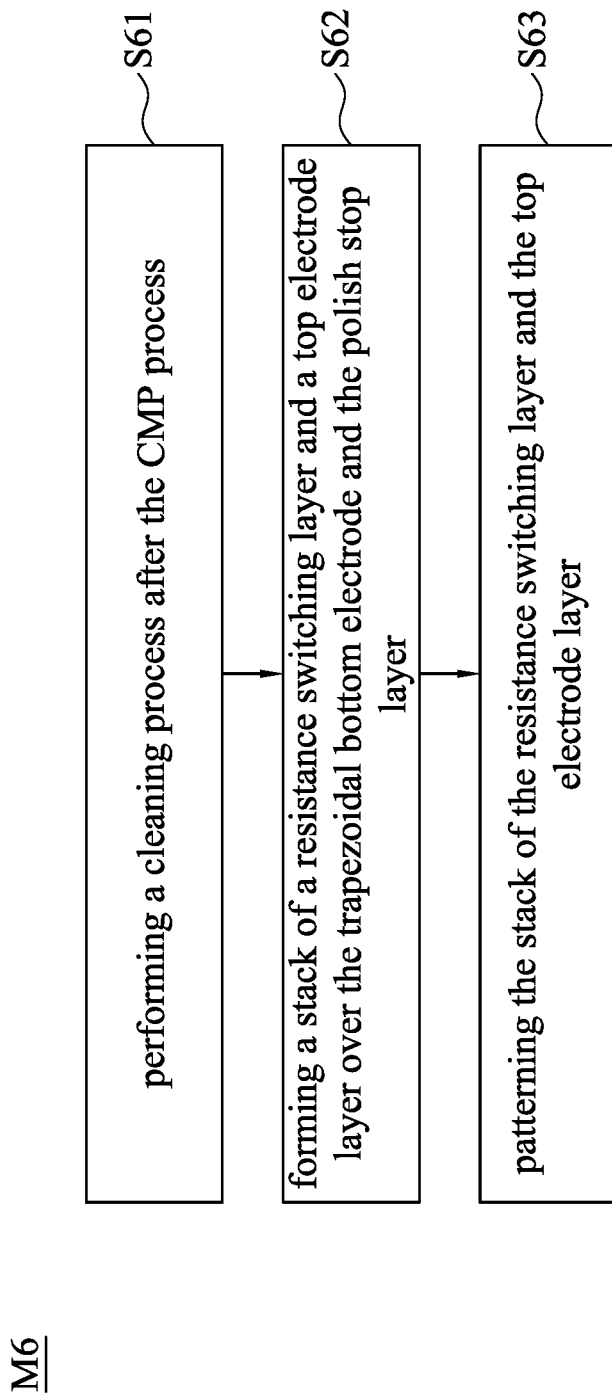
FIG. 13 is a flow chart of a method of forming a memory device in accordance with some embodiments.
Figure 14A:
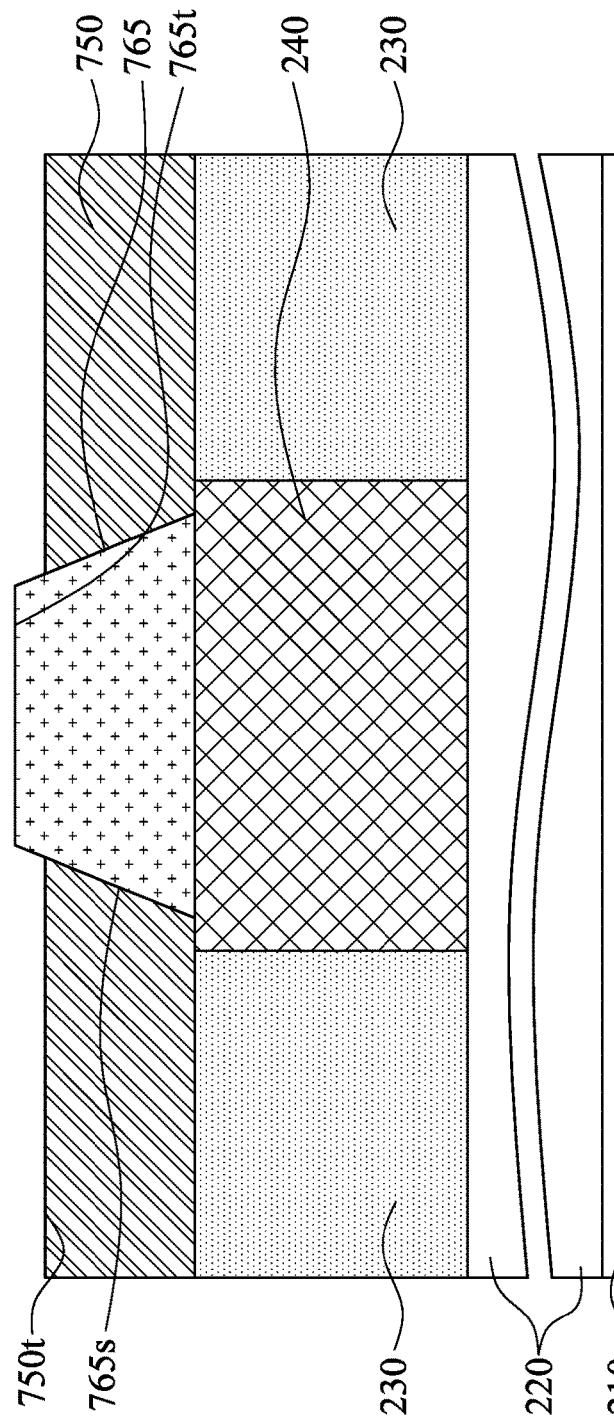
FIGS. 14A, 14B and 14C are cross-sectional views of the memory device at various stages of the method in FIG. 13 in accordance with some embodiments of the present disclosure.
Figure 14B:
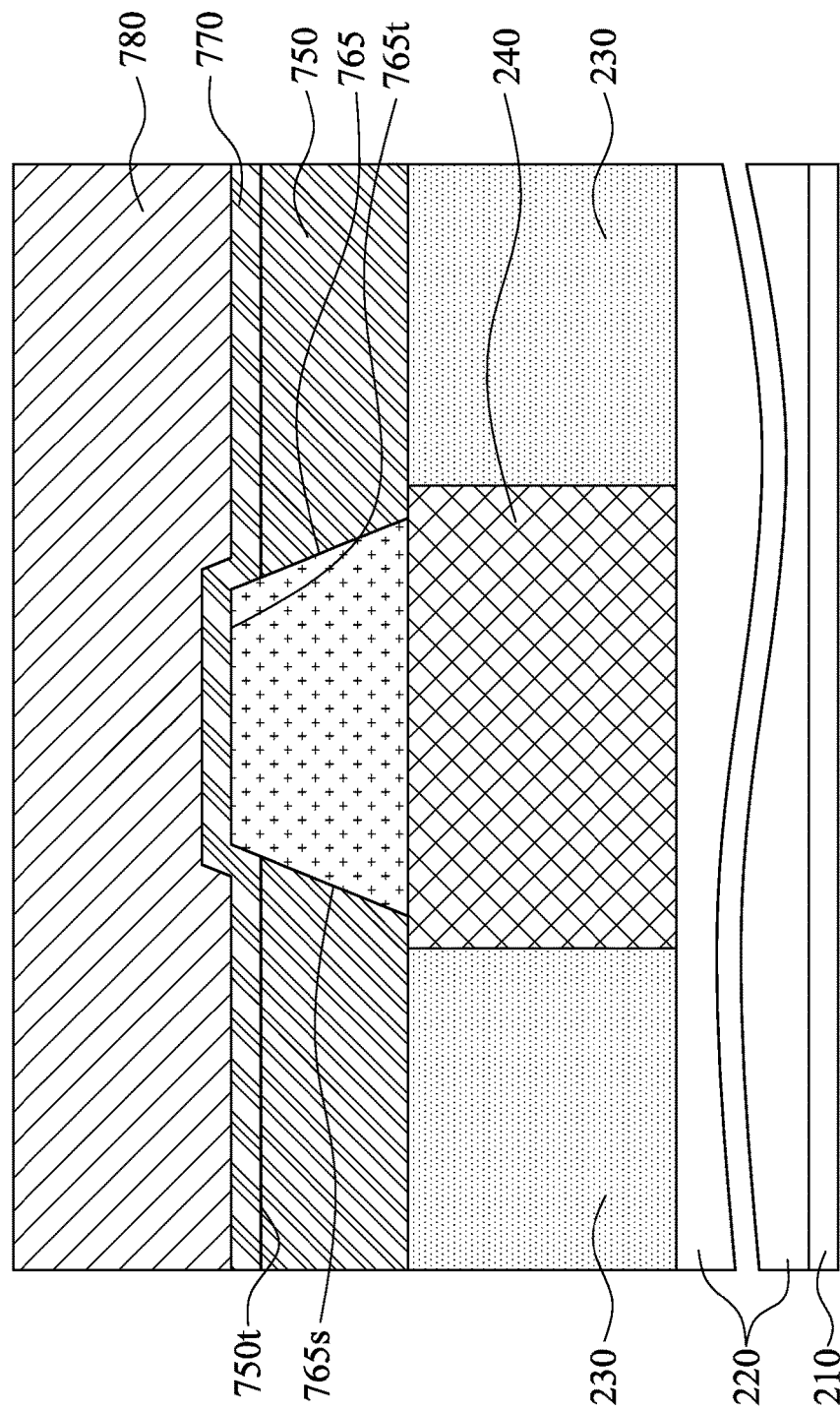
Figure 14C:
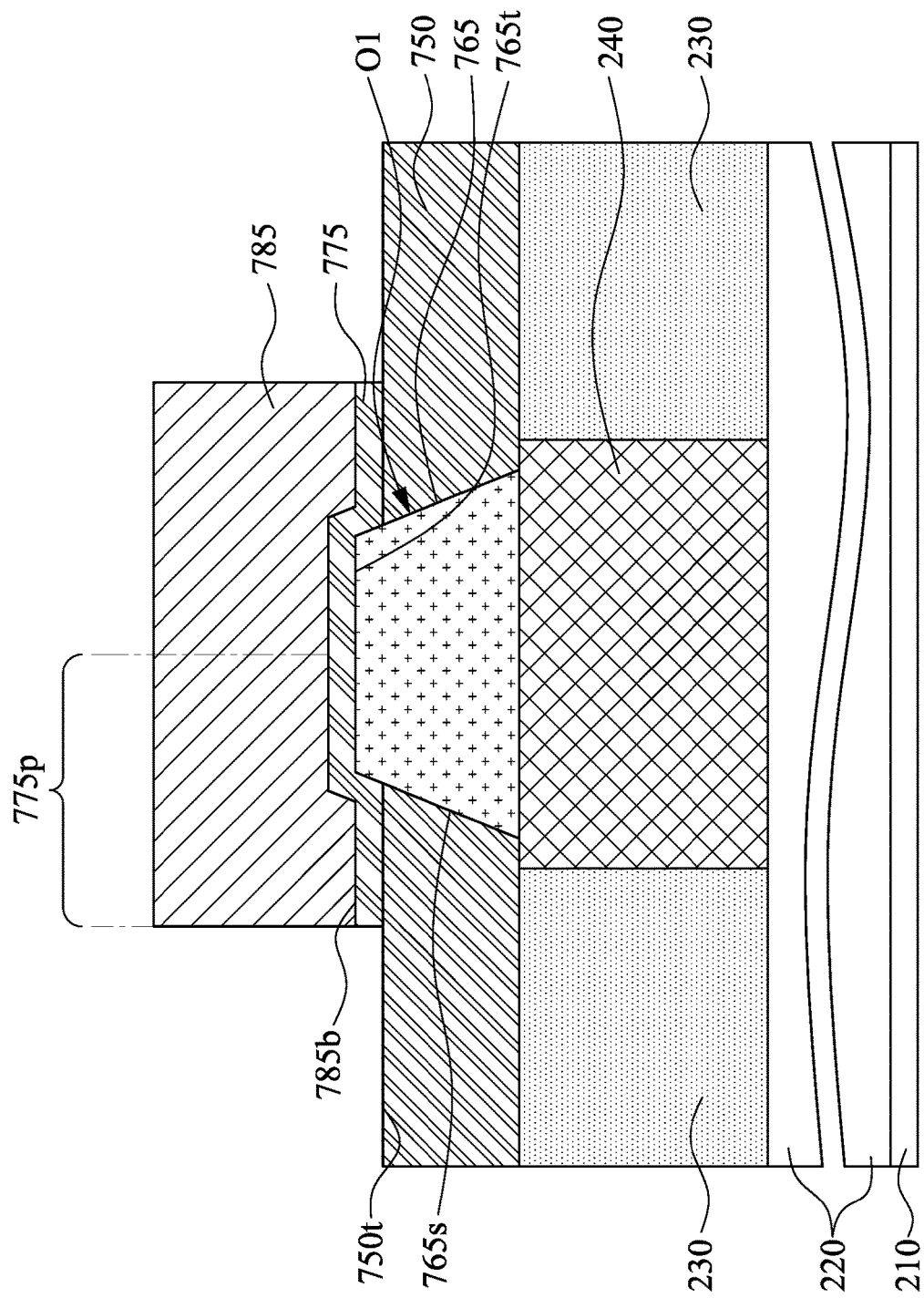

Referring now to FIG. 13, illustrated is a method M6 of forming a memory device in accordance with some embodiments, wherein a cleaning process is performed after forming a trapezoidal bottom electrode. It is understood that parts of the method M6 and/or any of the exemplary metallization and dielectric layers discussed with reference to the method M6 may be fabricated by a BEOL process flow, and thus some processes are briefly described herein. FIGS. 14A, 14B and 14C are cross-sectional views of an SOC 700, which may be similar in many aspects to SOC 100, in various stages of fabrication in accordance with some embodiments of the present disclosure.

The method M6 begins at block S61 which may be performed following block S43 of the method M4. In block S61, a cleaning process is performed to the polished surface after the CMP process of forming the trapezoidal bottom electrode 765. With reference to FIG. 14A, in some embodiments of block 61, de-ionized water or the like may be used to clear away residue from the CMP process, such as the slurry and abrasive particles on the polished surfaces of the polish stop layer 750 and of the trapezoidal bottom electrode 765. The cleaning process may result in thinning down the polish stop layer 750, which in turn will lead to a step height between the top surface 750t of the polish stop layer 750 and the top surface 765t of the trapezoidal bottom electrode 765. Such a step height would result in a resistance switching layer coated around a sharp corner of the bottom electrode. However, because the sidewall 765s of the trapezoidal bottom electrode 765 is sloped as discussed previously with respect to the bottom electrode 565, the sidewall 765s of the bottom electrode 765 still extends at an obtuse angle relative to the concave top surface 765t of the bottom electrode 765. As a result, a subsequently formed resistance switching layer 770 (as shown in FIG. 14B) will be coated around a smooth top corner, rather than a sharp top corner. Therefore, the unwanted leakage paths between the trapezoidal bottom electrode 765 and a subsequently formed top electrode can still be reduced, even if the cleaning process leads to a step height between the trapezoidal bottom electrode 765 and the polish stop layer 750.

Returning to FIG. 13, the method M6 then proceeds to block S62 where a where a stack of a resistance switching layer and a top electrode layer is formed over the trapezoidal bottom electrode and the polish stop layer. With reference to FIG. 14B, in some embodiments of block S62, a resistance switching layer 770 and a top electrode layer 780 are formed in sequence over the trapezoidal bottom electrode 765 and the polish stop layer 750. The resistance switching layer 770 is a high-k dielectric layer that includes a metal oxide, as discussed previously with respect to the resistance switching layer 270. The top electrode layer 780 is a metal layer as discussed previously with respect to the top electrode layer 280.

Returning to FIG. 13, the method M6 then proceeds to block S63 where the stack of the resistance switching layer and the top electrode layer is patterned. With reference to FIG. 14C, in some embodiments of block S33, the resistance switching layer 770 and the top electrode layer 780 are patterned to form a stack of a resistance switching layer 775 and a top electrode 785 over the bottom electrode 765. The bottom and top electrodes 765, 785, and the resistance switching layer 775 therebetween are in combination referred to as the MIM structure of RRAM cell, as discussed previously with respect to FIGS. 1 and 2. In some embodiments, the resistance switching layer 775 is conformal to the bottom electrode 765 and the polish stop layer 750, and hence the resistance switching portion 775 has a stepped portion 775p extending from the top surface 750t of the polish stop layer 750 to the top surface 765t of the bottom electrode 765. In further embodiments, the top electrode 785 has a stepped bottom surface 485b in contact with and conformal to the stepped portion 775p of the resistance switching layer 775.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that unwanted distribution of filaments around the corner of the bottom electrode of the RRAM cell can be prevented, which in turn will be advantageous for reducing unwanted leakage paths between the bottom and top electrodes. Another advantage is that reliability of the RRAM cell can be improved because of the reduction of unwanted leakage paths.

In some embodiments, a memory device includes a metal structure, a first dielectric layer, a bottom electrode, a second dielectric layer, a resistance switching layer, and a top electrode. The first dielectric layer surrounds the metal structure. The bottom electrode is in contact with a top surface of the metal structure. The second dielectric layer surrounds the bottom electrode, in which a top surface of the bottom electrode is higher than a top surface of the second dielectric layer. The resistance switching layer is over the bottom electrode. The top electrode is over the resistance switching layer.

In some embodiments, a memory device includes a metallization layer, a bottom electrode, a dielectric layer, a resistance switching layer, and a top electrode. The metallization layer is embedded in an inter-metal dielectric layer. The bottom electrode is in contact with a top surface of the metallization layer. The dielectric layer surrounds the bottom electrode, in which a top surface of the bottom electrode is recessed from a top surface of the dielectric layer toward the metallization layer. The resistance switching layer is over the bottom electrode. The top electrode is over the resistance switching layer.

In some embodiments, a method of forming a memory device includes: forming a polish stop layer over a metallization layer in an inter-metal dielectric layer; performing an etching process to form an opening in the polish stop layer, in which a width of an upper portion of the opening is less than a width of a middle portion of the opening when viewed in cross-section; forming an electrode material in the opening and over the polish stop layer; planarizing the electrode material until a top surface of the polish stop layer is exposed such that a bottom electrode is formed in the opening; and forming a stack of a resistance switching layer and a top electrode over the bottom electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a metal structure;
   a first dielectric layer surrounding the metal structure;
   a bottom electrode in contact with a top surface of the metal structure;
   a second dielectric layer surrounding the bottom electrode, wherein a top surface of the bottom electrode is higher than a top surface of the second dielectric layer, and a width of a first portion of the bottom electrode above the top surface of the second dielectric layer is narrower than a width of a second portion of the bottom electrode below the top surface of the second dielectric layer;
   a resistance switching layer over the bottom electrode; and
   a top electrode over the resistance switching layer.

2. The memory device of claim 1, wherein a sidewall of the bottom electrode is curved.

3. The memory device of claim 2, wherein the curved sidewall of the bottom electrode extends past the top surface of the second dielectric layer.

4. The memory device of claim 1, wherein the resistance switching layer extends along the top surface of the bottom electrode and beyond opposite edges of the top surface of the bottom electrode.

5. The memory device of claim 1, wherein a portion of the resistance switching layer lines a curved sidewall of an upper portion of the bottom electrode.

6. The memory device of claim 1, wherein a portion of the resistance switching layer lines a slant sidewall of an upper portion of the bottom electrode.

7. The memory device of claim 1, wherein the resistance switching layer extends along the top surface of the second dielectric layer.

8. The memory device of claim 1, wherein a first portion of the resistance switching layer on the bottom electrode is higher than a second portion of the resistance switching layer on the second dielectric layer.

9. The memory device of claim 1, wherein a first portion of the top electrode directly above the bottom electrode has a first thickness measured in a direction perpendicular to the top surface of the metal structure, a second portion of the top electrode directly above the second dielectric layer has a second thickness measured in the direction perpendicular to the top surface of the metal structure, and the first thickness is thinner than the second thickness.

10. A memory device, comprising:
a metal structure;
a first dielectric layer laterally surrounding the metal structure;
a bottom electrode landing on the metal structure;
a second dielectric layer laterally surrounding the bottom electrode, wherein a sidewall of the bottom electrode extends beyond a top surface of the second dielectric layer, and the sidewall of the bottom electrode above the top surface of the second dielectric layer extends at an obtuse angle relative to the top surface of the second dielectric layer;
a resistance switching layer over the bottom electrode; and
a top electrode over the resistance switching layer.

11. The memory device of claim 10, wherein the resistance switching layer lines the sidewall of the bottom electrode that extends beyond the top surface of the second dielectric layer.

12. The memory device of claim 10, wherein the resistance switching layer has a wider width than a top surface of the bottom electrode.

13. The memory device of claim 10, wherein the top electrode has a wider width than a top surface of the bottom electrode.

14. The memory device of claim 10, wherein the top electrode has a concave bottom surface.

15. A memory device, comprising:
a metal structure;
a first dielectric layer laterally surrounding the metal structure;
a bottom electrode in contact with a top surface of the metal structure;
a second dielectric layer laterally surrounding the bottom electrode;
a resistance switching layer over the bottom electrode and the second dielectric layer, wherein the resistance switching layer is higher on the bottom electrode than on the second dielectric layer; and
a top electrode over the resistance switching layer.

16. The memory device of claim 15, wherein a top surface of the bottom electrode is higher than a top surface of the second dielectric layer.

17. The memory device of claim 15, wherein the resistance switching layer is in contact with a sidewall of the bottom electrode.

18. The memory device of claim 15, wherein a sidewall of the resistance switching layer and a sidewall of the top electrode is coterminous.

19. The memory device of claim 1, wherein the top electrode has a concave bottom surface.

20. The memory device of claim 10, wherein a sidewall of the bottom electrode is curved.

* * * * *